United States Patent
Uchida et al.

(10) Patent No.: US 11,462,681 B2
(45) Date of Patent: Oct. 4, 2022

(54) MAGNETIC STORAGE ELEMENT, MAGNETIC HEAD, MAGNETIC STORAGE DEVICE, ELECTRONIC APPARATUS, AND METHOD FOR MANUFACTURING MAGNETIC STORAGE ELEMENT

(71) Applicant: SONY SEMICONDUCTOR SOLUTIONS CORPORATION, Kanagawa (JP)

(72) Inventors: Hiroyuki Uchida, Kanagawa (JP); Masanori Hosomi, Kanagawa (JP); Kazuhiro Bessho, Kanagawa (JP); Yutaka Higo, Kanagawa (JP); Yo Sato, Kanagawa (JP); Naoki Hase, Kanagawa (JP); Hiroyuki Ohmori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/251,329

(22) PCT Filed: Jun. 6, 2019

(86) PCT No.: PCT/JP2019/022598
§ 371 (c)(1),
(2) Date: Dec. 11, 2020

(87) PCT Pub. No.: WO2019/244662
PCT Pub. Date: Dec. 26, 2019

(65) Prior Publication Data
US 2021/0288244 A1 Sep. 16, 2021

(30) Foreign Application Priority Data
Jun. 19, 2018 (JP) .............................. JP2018-116161

(51) Int. Cl.
*G11C 11/15* (2006.01)
*H01L 43/08* (2006.01)
(Continued)

(52) U.S. Cl.
CPC ............ *H01L 43/08* (2013.01); *G11B 5/3909* (2013.01); *G11C 11/161* (2013.01);
(Continued)

(58) Field of Classification Search
CPC ....... H01L 43/08; H01L 27/228; H01L 43/02; H01L 43/12; G11B 5/3909; G11C 11/161
(Continued)

(56) References Cited

U.S. PATENT DOCUMENTS

| 8,063,459 B2 * | 11/2011 | Ranjan ................. G11C 11/161 |
| | | 365/158 |
| 2005/0110004 A1 * | 5/2005 | Parkin ................... H01F 41/307 |
| | | 257/30 |

(Continued)

FOREIGN PATENT DOCUMENTS

| EP | 1903623 A2 * | 3/2008 | ............. B82Y 10/00 |
| EP | 3326217 A1 * | 5/2018 | ........... G11C 11/161 |

(Continued)

OTHER PUBLICATIONS

International Search Report prepared by the Japan Patent Office dated Jul. 26, 2019, for International Application No. PCT/JP2019/022598.

*Primary Examiner* — Viet Q Nguyen
(74) *Attorney, Agent, or Firm* — Sheridan Ross P.C.

(57) ABSTRACT

Provided is a magnetic storage element including a stack structure which includes a fixed layer whose magnetization direction is fixed, a storage layer whose magnetization direction is reversible, and a non-magnetic layer sandwiched between the fixed layer and the storage layer. The magne- (Continued)

tization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

20 Claims, 12 Drawing Sheets

(51) Int. Cl.
    *G11B 5/39*     (2006.01)
    *G11C 11/16*     (2006.01)
    *H01L 27/22*     (2006.01)
    *H01L 43/02*     (2006.01)
    *H01L 43/10*     (2006.01)
    *H01L 43/12*     (2006.01)

(52) U.S. Cl.
    CPC ............ *H01L 27/228* (2013.01); *H01L 43/02* (2013.01); *H01L 43/10* (2013.01); *H01L 43/12* (2013.01)

(58) Field of Classification Search
    USPC ........................................................ 365/173
    See application file for complete search history.

(56) References Cited

U.S. PATENT DOCUMENTS

| | | | |
|---|---|---|---|
| 2007/0048485 A1* | 3/2007 | Jogo | H01L 43/10 428/64.1 |
| 2007/0230070 A1* | 10/2007 | Mizuno | B82Y 10/00 |
| 2012/0056285 A1 | 3/2012 | Bessho et al. | |
| 2015/0294707 A1* | 10/2015 | Apalkov | H01L 43/10 365/158 |
| 2016/0035970 A1 | 2/2016 | Tang et al. | |
| 2018/0005746 A1* | 1/2018 | Thomas | G11C 11/161 |
| 2019/0013461 A1* | 1/2019 | Wang | G11C 11/16 |
| 2019/0067367 A1 | 2/2019 | Sejima | |
| 2019/0288031 A1* | 9/2019 | Satoh | H01F 10/3268 |

FOREIGN PATENT DOCUMENTS

| | | |
|---|---|---|
| JP | 2005-203702 | 7/2005 |
| JP | 2007-096075 | 4/2007 |
| JP | 2012-059808 | 3/2012 |
| JP | 2016-015490 | 1/2016 |
| JP | 2017-183602 | 10/2017 |
| WO | WO-2020105263 A1 * | 5/2020 |

\* cited by examiner

FIG.10

| B content [atm%] | 10% | 20% | 30% | 40% | 50% | 60% | 70% | 80% | 90% | 100% |
|---|---|---|---|---|---|---|---|---|---|---|
| depo rate | ○ | ○ | ○ | ○ | ○ | ○ | ○ | ○ | × | × |
| Hc | × | × | ○ | ○ | ○ | ○ | ○ | ○ | — | — |

# MAGNETIC STORAGE ELEMENT, MAGNETIC HEAD, MAGNETIC STORAGE DEVICE, ELECTRONIC APPARATUS, AND METHOD FOR MANUFACTURING MAGNETIC STORAGE ELEMENT

CROSS REFERENCE TO RELATED APPLICATIONS

This application is a national stage application under 35 U.S.C. 371 and claims the benefit of PCT Application No. PCT/JP2019/022598 having an international filing date of 6 Jun. 2019, which designated the United States, which PCT application claimed the benefit of Japanese Patent Application No. 2018-116161, filed 19 Jun. 2018, the entire disclosures of each of which are incorporated herein by reference.

FIELD

The present disclosure relates to a magnetic storage element, a magnetic head, a magnetic storage device, an electronic apparatus, and a method for manufacturing a magnetic storage element.

BACKGROUND

With the rapid development of various information apparatuses ranging from large-capacity servers to mobile terminals, in elements such as memories and logics configuring the information apparatuses, further improvement in performance such as high integration, high speed, and low power consumption has been pursued. In particular, the progress of non-volatile semiconductor memories is remarkable. For example, a flash memory as a large-capacity file memory has become widespread with the momentum to drive out hard disk drives. On the other hand, considering an application to a code storage and a working memory, various types of semiconductor memories such as a ferroelectric random access memory (FeRAM), a magnetic random access memory (MRAM), and a phase-change random access memory (PCRAM) have been developed to replace a NOR flash memory, a dynamic random access memory (DRAM), and the like to be generally used at present. Note that some of these have already been put to practical use.

The MRAM to be one of the above examples stores information by utilizing a change in the electric resistance by changing a magnetization state of a magnetic material of a magnetic storage element of the MRAM (reversing a magnetization direction). Therefore, the stored information can be read by determining a resistance state of the magnetic storage element determined by the change in the magnetization state, specifically, the magnitude of the electric resistance of the magnetic storage element. Since the MRAM can perform high-speed operation, can perform almost infinite ($10^{15}$ times or more) rewriting, and has high reliability, the MRAM is already used in fields such as industrial automation and aircraft. In addition, the MRAM is expected to be developed into the code storage and the working memory in the future because of the high-speed operation and the high reliability.

However, since the MRAM that reverses the magnetization direction by a current magnetic field generated from a wire has low magnetization reversal efficiency, there is a problem in reducing the power consumption and increasing the capacity. This is an essential problem due to a storage principle of the MRAM, that is, a method for reversing the magnetization direction by the current magnetic field generated from the wire. Therefore, a spin transfer torque-magnetic random access memory (STT-MRAM) (magnetic storage device), which uses spin torque magnetization reversal to generate the magnetization reversal without using the current magnetic field, has attracted attention.

The STT-MRAM has, as the magnetic storage element, a magnetic tunnel junction (MTJ) element (magnetic storage element) having two magnetic layers and an insulating layer sandwiched between these magnetic layers. Note that the MTJ element may be referred to as a tunneling magneto resistive (TMR) element. In the STT-MRAM, when spin-polarized electrons that have passed through the magnetic layer whose magnetization direction is fixed enter the magnetic layer (free magnetic layer) whose magnetization direction is free, a torque is applied in the magnetization direction of the magnetic layer which the spin-polarized electrons enter. At this time, the magnetization direction of the free magnetic layer can be reversed by flowing a current of a predetermined threshold value or more, and rewriting of 0/1 can be performed by changing a polarity of the flown current. In addition, the current for reversing the magnetization method is 1 mA or less in the MTJ element having a scale of about 0.1 μm. That is, in the STT-MRAM, the smaller the volume of the MTJ element, the smaller the amount of current required for reversing the magnetization of the magnetic layer. Further, since the STT-MRAM is not provided with a wire for generating the current magnetic field for storage, it is possible to simplify a structure of the MTJ element. Therefore, the STT-MRAM is expected as a non-volatile memory that can perform the high-speed operation, can perform almost infinite rewriting, and has the low power consumption and the large capacity.

As a ferromagnetic material used in the STT-MRAM, various materials have been examined. However, generally, a material having perpendicular magnetic anisotropy is more suitable for the low power consumption and the large capacity of the MTJ element than a material having in-plane magnetic anisotropy. The reason for this is that, in the material having the perpendicular magnetization anisotropy, an energy barrier which the spin-polarized electrons should exceed during spin torque magnetization reversal is low. Another reason is that the high magnetic anisotropy of the material having the perpendicular magnetic anisotropy works favorably in maintaining thermal stability of a storage carrier in the MTJ element when the MTJ element is miniaturized for the large capacity.

In order to apply the manufacturing of the STT-MRAM including the MTJ element having the ferromagnetic material having the perpendicular magnetic anisotropy to an existing semiconductor manufacturing process, it is required that magnetic characteristics of the ferromagnetic material included in the MTJ element be stable against a heat load of about 400 degrees applied during a wire forming process for forming the wire. Note that, as conventional technology regarding the magnetic material included in the MTJ element, a magnetic material containing a high concentration of boron (B) disclosed in Patent Literature 1 below, a magnetic material containing a rare earth element and B disclosed in Patent Literature 2 below, and the like can be mentioned.

CITATION LIST

Patent Literature

Patent Literature 1: U.S. Pat. No. 8,852,760
Patent Literature 2: JP 2013-69788 A Non Patent Literature Non Patent Literature 1: S. Mangin et al. Nature materials, vol.5 March 2006, p.210.

SUMMARY

Technical Problem

However, when it is desired to form the magnetic layer of the MTJ element (magnetic storage element) using the magnetic material containing a high concentration of B disclosed in the above Patent Literature 1, a film formation rate (sputtering rate) of the magnetic layer is extremely low. Therefore, it can be said that the STT-MRAM (magnetic storage device) using the magnetic material disclosed in the above Patent Literature 1 has low mass productivity. Further, when it is desired to form the magnetic layer of the MTJ element by the ferromagnetic material containing the rare earth element disclosed in the above Patent Literature 2, the rare earth element may be diffused by the heat of about 400° C. applied during a manufacturing process, and the magnetic characteristics of the MTJ element may be deteriorated.

Accordingly, the present disclosure proposes a new and improved magnetic storage element, magnetic head, magnetic storage device, electronic apparatus, and method for manufacturing a magnetic storage element, capable of securing high mass productivity while suppressing deterioration of magnetic characteristics due to heat treatment of a magnetic layer.

Solution to Problem

According to the present disclosure, a magnetic storage element is provided that includes: a stack structure which includes a fixed layer whose magnetization direction is fixed, a storage layer whose magnetization direction is reversible, and a non-magnetic layer sandwiched between the fixed layer and the storage layer, wherein the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

Moreover, according to the present disclosure, a magnetic head is provided that includes: a stack structure which includes a fixed layer whose magnetization direction is fixed, a storage layer whose magnetization direction is reversible, and a non-magnetic layer sandwiched between the fixed layer and the storage layer, wherein the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

Moreover, according to the present disclosure, a magnetic storage device is provided that includes: a plurality of magnetic storage elements which hold information according to a magnetization state of a magnetic material, wherein each of the magnetic storage elements has a stack structure which includes a fixed layer whose magnetization direction is fixed, a storage layer whose magnetization direction is reversible, and a non-magnetic layer sandwiched between the fixed layer and the storage layer, wherein the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

Moreover, according to the present disclosure, an electronic apparatus is provided that includes: a magnetic storage device which has a plurality of magnetic storage elements holding information according to a magnetization state of a magnetic material, wherein each of the magnetic storage elements has a stack structure which includes a fixed layer whose magnetization direction is fixed, a storage layer whose magnetization direction is reversible, and a non-magnetic layer sandwiched between the fixed layer and the storage layer, wherein the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

Furthermore, according to the present disclosure, a method for manufacturing a magnetic storage element is provided that includes: a stack structure which includes a fixed layer whose magnetization direction is fixed, a storage layer whose magnetization direction is reversible, and a non-magnetic layer sandwiched between the fixed layer and the storage layer, wherein the method includes forming the fixed layer or the storage layer by a sputtering method so that the fixed layer or the storage layer has a region which contains at least one contained element selected from the element group consisting of B, C, N, Al, Mg, and Si at 30 atm % or more and 80 atm % or less.

Advantageous Effects of Invention

As described above, according to the present disclosure, it is possible to provide a magnetic storage element, a magnetic head, a magnetic storage device, an electronic apparatus, and a method for manufacturing a magnetic storage element, capable of securing high mass productivity while suppressing deterioration of magnetic characteristics due to heat treatment of a magnetic layer.

Note that the above effects are not necessarily restrictive, and any effects described in the present specification or other effects grasped from the present specification may be exhibited in addition to or in place of the above effects.

BRIEF DESCRIPTION OF DRAWINGS

FIG. 10 is a table summarizing results of the coercive force (Hc) after the heat treatment and the film formation rate with respect to the B concentration, obtained by an examination of the present inventors.

DESCRIPTION OF EMBODIMENTS

Figure 1:
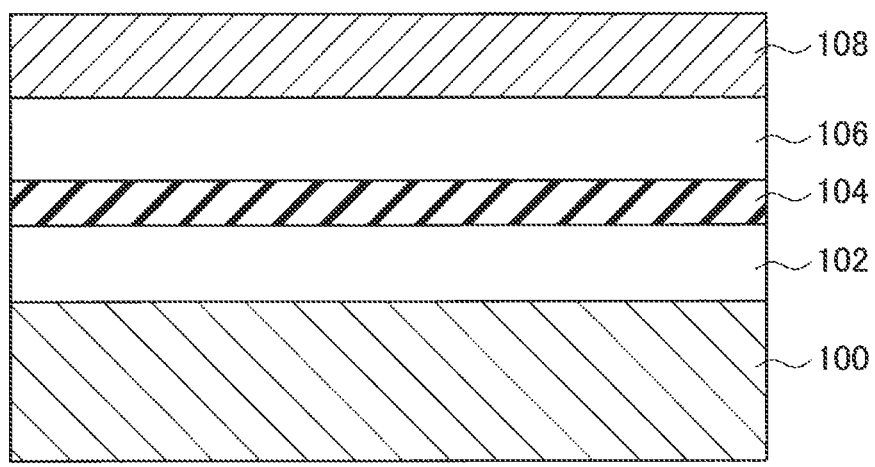
FIG. 1 is an explanatory view schematically illustrating an example of a stack structure of an MTJ element 10.

Hereinafter, preferred embodiments of the present disclosure will be described in detail with reference to the accompanying drawings. Note that, in the present specification and the drawings, redundant description of components having substantially the same functional configuration is omitted by assigning the same reference numerals.

Further, in the present specification and the drawings, a plurality of components having substantially the same or similar functional configuration may be distinguished from each other by adding different numerals after the same reference numeral. However, when it is unnecessary to particularly distinguish each of the plurality of components having substantially the same or similar functional configuration, only the same reference numeral is assigned. Further, similar components in different embodiments may be distinguished from each other by adding different alphabets after the same reference numerals. However, when it is unnecessary to particularly distinguish each of similar components, only the same reference numeral is assigned.

Further, the drawings referred to in the following description are drawings for facilitating the description and understanding of an embodiment of the present disclosure. For easy understanding, shapes, dimensions, ratios, and the like illustrated in the drawings may be different from those in an actual case. Further, elements and the like illustrated in the drawings can be appropriately changed in design in consideration of the following description and known technologies. Further, in the following description, an up-down direction of a stack structure of the elements and the like corresponds to a relative direction when a surface on a substrate provided with the elements is upward, and may be different from an up-down direction according to the actual gravitational acceleration.

Further, in the following description, when a magnetization direction (magnetic moment) and magnetic anisotropy are described, for convenience, terms such as a "perpendicular direction" (a direction perpendicular to a film surface or a stack direction of a stack structure) and an "in-plane direction" (a direction parallel to the film surface or a direction perpendicular to the stack direction of the stack structure) are used. However, these terms do not necessarily mean an exact direction of the magnetization. For example, words such as "a magnetization direction is a perpendicular direction" and "having perpendicular magnetic anisotropy" mean that the magnetization in the perpendicular direction is superior to the magnetization in the in-plane direction. Similarly, for example, words such as "a magnetization direction is an in-plane direction" and "having in-plane magnetic anisotropy" means that the magnetization in the in-plane direction is superior to the magnetization in the perpendicular direction.

Note that the description will be given in the following order.

1. Technical background according to present disclosure
   1.1. Outline of STT-MRAM
   1.2. Basic structure of MTJ element
   1.3. For writing and reading mechanisms
   1.4. For in-plane magnetization type and perpendicular magnetization type STT-MRAMs
2. Embodiment of present disclosure
   2.1. Structure of MTJ element
   2.2. Method for manufacturing MTJ element
   2.3. Modification
   2.3.1 First modification
   2.3.2 Second modification
3. Example
   3.1. Examination of coercive force
   3.2. Examination of film formation rate
4. Configuration example of magnetic storage device
5. Configuration example of electronic apparatus
   5.1. Appearance example of electronic apparatus
   5.2. Internal configuration example of electronic apparatus
6. Supplement

1. TECHNICAL BACKGROUND ACCORDING TO PRESENT DISCLOSURE

1.1. Outline of STT-MRAM

First, before describing an embodiment of the present disclosure, a technical background according to the present disclosure will be described. The technology according to the present disclosure relates to an STT-MRAM (spin injection MRAM).

As described above, since MRAMs that store information depending on a magnetization state of a magnetic material can perform high-speed operation, can perform almost infinite ($10^{15}$ times or more) rewriting, and have high reliability, the MRAMs are already used in various fields. Among the MRAMs, in an MRAM that reversing the magnetization of a magnetic material by a current magnetic field generated from a wire, it is difficult to reduce power consumption and increase a capacity, due to a magnetization reversal method. This is because, in the MRAM utilizing magnetization reversal using the current magnetic field from the wire, a current of a predetermined threshold value or more is required to generate a current magnetic field having a strength capable of reversing the magnetization of a magnetic material, and power consumption at the time of writing tends to increase. Further, in the MRAM utilizing the magnetization reversal using the current magnetic field from the wire, since the wire for generating the current magnetic field is provided for each magnetic storage element, there is a limit to miniaturization of the magnetic storage element.

Therefore, an MRAM in which the magnetization of the magnetic material is reversed by a method other than using the current magnetic field from the wire is examined. More specifically, an STT-MRAM in which the magnetization of the magnetic material is reversed by using spin torque magnetization reversal is examined. The STT-MRAM has advantages of the MRAM that high-speed operation can be performed and the number of times of rewriting is almost infinite, and can reduce the power consumption and increase the capacity. Therefore, the STT-MRAM is highly expected.

Specifically, the STT-MRAM has, as a magnetic storage element, an MTJ element having two magnetic layers and an insulating layer sandwiched between these two magnetic layers. The STT-MRAM utilizes that, in the MTJ element, when spin-polarized electrons passing through one magnetic layer (fixed magnetization layer) whose magnetization direction is fixed in a certain direction enter the other magnetic layer (free magnetization layer) whose magnetization direction is not fixed, a torque is applied to the other magnetic layer (this is referred to as a spin injection torque). More specifically, in the STT-MRAM, by applying a current of a threshold value or more to the MTJ element, applying the torque to the other magnetic layer, and reversing the magnetic direction of the magnetic layer (magnetization reversal), information is stored in the MTJ element. An absolute value of the current required to generate the spin torque magnetization reversal described above is 100 µA or less in the MTJ element with a scale of about 50 nm. Furthermore, since the current value decreases as the volume of the MTJ element decreases, it is possible to reduce the current by scaling the MTJ element. Further, in the STT-MRAM, since there is no need for a wire for generating a current magnetic field for storing the information in the MTJ element, there is also an advantage that a cell structure can be simplified.

The MTJ element is used as the storage element of the STT-MRAM. The MTJ element mainly has a fixed layer and a storage layer made of a magnetic material, and a non-magnetic layer provided between the fixed layer and the storage layer. In addition, the MTJ element performs storage by utilizing that, when spin-polarized electrons having passed through a magnetic material (fixed layer) having a magnetic moment fixed in a predetermined direction enter the other magnetic material (storage layer), a torque is applied to a magnetic moment (magnetization direction) of the other magnetic material to reverse the magnetic moment. Specifically, a magnetic moment of a magnetic material to which a current of a predetermined threshold value or more flows and a torque of a predetermined threshold value or more is applied by the spin-polarized electrons is reversed in a direction parallel to the applied torque. Note that the reversal direction of the magnetic moment can be controlled by changing the polarity of the current flowing through the magnetic material. Furthermore, in the MTJ element, in a parallel state in which the directions of the magnetic moments of the fixed layer and the storage layer are the same, an electric resistance in a non-magnetic layer is lower, and an electric resistance of the MTJ element as a whole is lower, as compared with an anti-parallel state in which the directions of both the magnetic moments are opposite. Therefore, in the MTJ element, information of 1/0 is stored by utilizing a difference in the resistance state caused by the state of the magnetic moment (magnetization state).

The absolute value of the current required to generate the spin torque magnetization reversal described above is 1 mA or less in the MTJ element with a scale of about 0.1 µm. Furthermore, a total value of the inversion current decreases as the volume of the MTJ element decreases. Note that, when the magnetization direction of the magnetic material is reversed by using the current magnetic field generated from the wire, a current required for the magnetization reversal is about several mA. Therefore, the STT-MRAM using the spin torque magnetization reversal can operate with low power consumption because the current required for writing can be extremely increased as compared with the MRAM using the magnetization reversal by the current magnetic field from the wire.

Further, in the MRAM using the magnetization reversal by the current magnetic field from the wire, a wire such as a word line that generates the current magnetic field is required. However, in the STT-MRAM, as described above, the wire is unnecessary. Therefore, the STT-MRAM can simplify a structure of the MTJ element as compared with the MRAM using the magnetization reversal by the current magnetic field from the wire, and the MTJ element can be easily miniaturized. As a result, it is possible to realize a further increase in the capacity of a magnetic memory.

As described above, the STT-MRAM can achieve low power consumption and large capacity while maintaining the characteristics of the MRAM in which information can be rewritten at high speed and almost without limitation.

1.2. Basic Structure of MTJ Element

Next, a basic structure of an MTJ element 10 of the STT-MRAM using the spin torque magnetization reversal will be described with reference to FIG. 1. FIG. 1 is an explanatory diagram schematically illustrating an example of a stack structure of the MTJ element 10.

The MTJ element 10 is a magnetic storage element that stores one piece of information (1/0). Address wires (that is, a word line and a bit line) orthogonal to each other are provided above and below the MTJ element 10, and the MTJ element 10 is connected to the word line and the bit line near an intersection of these wires. Note that, in FIG. 1, the illustration of these wires is omitted.

As illustrated in FIG. 1, the MTJ element 10 has a structure where a fixed layer 102 whose magnetic moment (magnetization direction) is fixed in a predetermined direction, a non-magnetic layer 104, a storage layer 106 in which a direction of a magnetic moment (magnetization direction) is variable, that is, reversible, and a cap layer 108 are sequentially stacked on a base layer 100. Although not illustrated in FIG. 1, the MTJ element 10 is sandwiched between an upper electrode and a lower electrode. Further, one terminal of the MTJ element 10 is electrically connected to another wire (not illustrated) and the word line (not illustrated) via a selection transistor (not illustrated), and the other terminal of the MTJ element 10 is electrically connected to the bit line (not illustrated). As a result, in the MTJ element 10 selected by the selection transistor, a voltage is applied between the lower electrode and the upper electrode of the MTJ element via the word line and the bit line, and reading and writing of information for the storage layer 106 of the MTJ element 10 are performed.

The fixed layer 102 is formed of a magnetic material containing a ferromagnetic material, and the direction of the magnetic moment thereof is fixed by a high coercive force or the like. The non-magnetic layer 104 is formed of various non-magnetic materials and the like, and is provided so as to be sandwiched between the fixed layer 102 and the storage layer 106. The storage layer 106 is formed of a magnetic material containing a ferromagnetic material, and the direction of the magnetic moment thereof changes according to the information to be stored. Further, the base layer 100 and the cap layer 108 function as an electrode, a crystal orientation control film, a protective film, and the like.

Note that, although a structure in which the non-magnetic layer 104 and the fixed layer 102 are stacked downward with respect to the storage layer 106 is illustrated as the stack structure of the MTJ element 10 in FIG. 1, the MTJ element 10 is not limited to the structure. For example, the MTJ element 10 may further include another layer, and positions of the fixed layer 102 and the storage layer 106 may be exchanged.

1.3. For Writing and Reading Mechanisms

Next, information writing and reading mechanisms in the MTJ element 10 will be described. First, the information writing mechanism in the MTJ element 10 will be described. In the MTJ element 10, writing of information to the storage layer 106 is performed using the spin torque magnetization reversal, as described above.

Here, details of the spin torque magnetization reversal will be described. Electrons are known to have two types of spin angular momentums. Therefore, the spin angular momentums are defined as two types of spin angular momentums, that is, upward spin angular momentums and downward spin angular momentums. In the non-magnetic material, the upward spin angular momentums and the downward spin angular momentums have the same number, and in the ferromagnetic material, there is a difference in both numbers.

Here, in the MTJ element 10, the fixed layer 102 and the storage layer 106 are in an anti-parallel state in which the directions of the magnetic moments are different from each other, and in this state, a case where electrons are caused to enter the storage layer 106 from the fixed layer 102 is considered.

When the electrons pass through the fixed layer 102, spin polarization occurs, that is, there is a difference in the number of upward spin angular momentums and downward spin angular momentums. Further, when a thickness of the non-magnetic layer 104 is sufficiently small, before the spin polarization is relaxed and becomes a non-polarized state (the number of upward and downward electrons is the same) in a normal non-magnetic material, the electrons can enter the storage layer 106.

In the storage layer 106, a direction of the spin polarization is opposite to that of the electrons that have entered. Therefore, in order to reduce the energy of the entire system, some of the electrons that have entered are inverted, that is, directions of the spin angular momentums change. At this time, since the spin angular momentums are preserved in the entire system, a reaction equivalent to the sum of changes in the spin angular momentums due to the inverted electrons is given to the magnetic moment (magnetization direction) of the storage layer 106.

When the current, that is, the number of electrons passing per unit time is small, the total number of electrons that change directions is also small, so that the change in the spin angular momentum generated in the magnetic moment of the storage layer 106 is also small. On the other hand, when the current, that is, the number of electrons passing per unit time is increased, it is possible to give a desired change in the spin angular momentum to the magnetic moment of the storage layer 106 within the unit time. When the temporal change in the spin angular momentum is torque and the torque exceeds a predetermined threshold value, the magnetic moment of the storage layer 106 starts reversing and becomes stable in a 180-degree reversal state. Note that the magnetic moment of the storage layer 106 becomes stable in a 180-degree reversal state because the magnetic material forming the storage layer 106 has an easy axis of magnetization and has uniaxial anisotropy. By the mechanism described above, the MTJ element 10 changes from the anti-parallel state to the parallel state in which the directions of the magnetic moments of the fixed layer 102 and the storage layer 106 are the same.

Further, in the parallel state, in a case where the current flows in a direction where the electrons are caused to enter the fixed layer 102 from the storage layer 106 in reverse, when the electrons reflected and inverted by the fixed layer 102 at the time of reaching the fixed layer 102 enter the storage layer 106, a torque is applied to the storage layer 106. Therefore, by the applied torque, the magnetic moment of the storage layer 106 is reversed, and the MTJ element 10 changes from the parallel state to the anti-parallel state.

However, an amount of inversion current for causing reversal from the parallel state to the anti-parallel state is larger than that in the case of causing reversal from the anti-parallel state to the parallel state. Regarding the reversal from the parallel state to the anti-parallel state, simply speaking, since the magnetic moment of the fixed layer 102 is fixed, the reversal in the fixed layer 102 is difficult, and the magnetic moment of the storage layer 106 is reversed in order to preserve the spin angular momentum of the entire system. As described above, storage of 1/0 in the MTJ element 10 is performed by flowing a current equal to or more than a predetermined threshold value corresponding to each polarity in the direction from the fixed layer 102 toward the storage layer 106 or in the opposite direction. As described above, by reversing the magnetic moment of the storage layer 106 in the MTJ element 10 and changing the resistance state of the MTJ element 10, writing of 1/0 in the MTJ element 10 is performed.

Next, the information reading mechanism in the MTJ element 10 will be described. In the MTJ element 10, reading of information from the storage layer 106 is performed using a magnetoresistance effect. Specifically, when the current is flown between the lower electrode (not illustrated) and the upper electrode (not illustrated) sandwiching the MTJ element 10, the resistance state of the MTJ element 10 changes on the basis of whether the directions of the magnetic moments of the fixed layer 102 and the storage layer 106 are parallel to each other or anti-parallel to each other. In addition, the information stored in the storage layer 106 can be read by determining the resistance state of the MTJ element 10, that is, the magnitude of the electric resistance indicated by the MTJ element 10.

1.4. For In-Plane Magnetization Type and Perpendicular Magnetization Type STT-MRAMs Incidentally, in STT-MRAMs, there are an in-plane magnetization type STT-MRAM using a magnetic material having magnetic anisotropy in an in-plane direction and a perpendicular magnetization type STT-MRAM using a magnetic material having magnetic anisotropy in a perpendicular direction. Generally, the perpendicular magnetization type STT-MRAM is more suitable for the low power consumption and the large capacity than the in-plane magnetization type STT-MRAM. This is because the perpendicular magnetization type STT-MRAM has a lower energy barrier which the electrons should exceed during the spin torque magnetization reversal, and high magnetic anisotropy of a perpendicular magnetization film works favorably in maintaining thermal stability of a storage carrier miniaturized by increasing the capacity.

Specifically, if an inversion current of the in-plane magnetization type STT-MRAM is defined as Ic_para, the inversion current can be represented by the following Formulas (1) and (2).

Inversion current from parallel state to anti-parallel
state: $Ic\_para = (A \cdot \alpha \cdot Ms \cdot V/g(0)/p)(Hk+2\pi Ms)$ (1)

Inversion current from anti-parallel state to parallel
state: $Ic\_para = -(A \cdot \alpha \cdot Ms \cdot V/g(\pi)/p)(Hk+2\pi Ms)$ (2)

Further, if an inversion current of the perpendicular magnetization type STT-MRAM is defined as Ic_perp, the inversion current can be represented by the following Formulas (3) and (4).

Inversion current from parallel state to anti-parallel
state: $Ic\_perp = (A \cdot \alpha \cdot Ms \cdot V/g(0)/p)(Hk-4\pi Ms)$ (3)

Inversion current from anti-parallel state to parallel
state: $Ic\_perp = -(A \cdot \alpha \cdot Ms \cdot V/g(\pi)/p)(Hk-4\pi Ms)$ (4)

In the above Formulas (1) to (4), A is a constant, α is a damping constant, Ms is a saturation magnetization, V is an element volume, g(0)p and g(π)p are coefficients related to efficiency at which the spin torque is transmitted to the opposing magnetic layer in parallel and anti-parallel states, respectively, and Hk is magnetic anisotropy (see Non-Patent Literature 1).

Here, in examining the inversion current in the in-plane magnetization type STT-MRAM and the perpendicular magnetization type STT-MRAM having the same magnetic material, the above Formula (1) and the above Formula (3) are compared, and the above Formula (2) and the above Formula (4) are compared. According to the comparison, (Hk-4πMs) in the case of the perpendicular magnetization type STT-MRAM is smaller than (Hk+2πMs) in the case of the in-plane magnetization type STT-MRAM. Therefore, it can be seen that the perpendicular magnetization type STT-MRAM has a smaller inversion current and is more suitable from the viewpoint of reducing the inversion current at the time of writing.

2. EMBODIMENT OF PRESENT DISCLOSURE

2.1. Structure of MTJ Element

Figure 2:
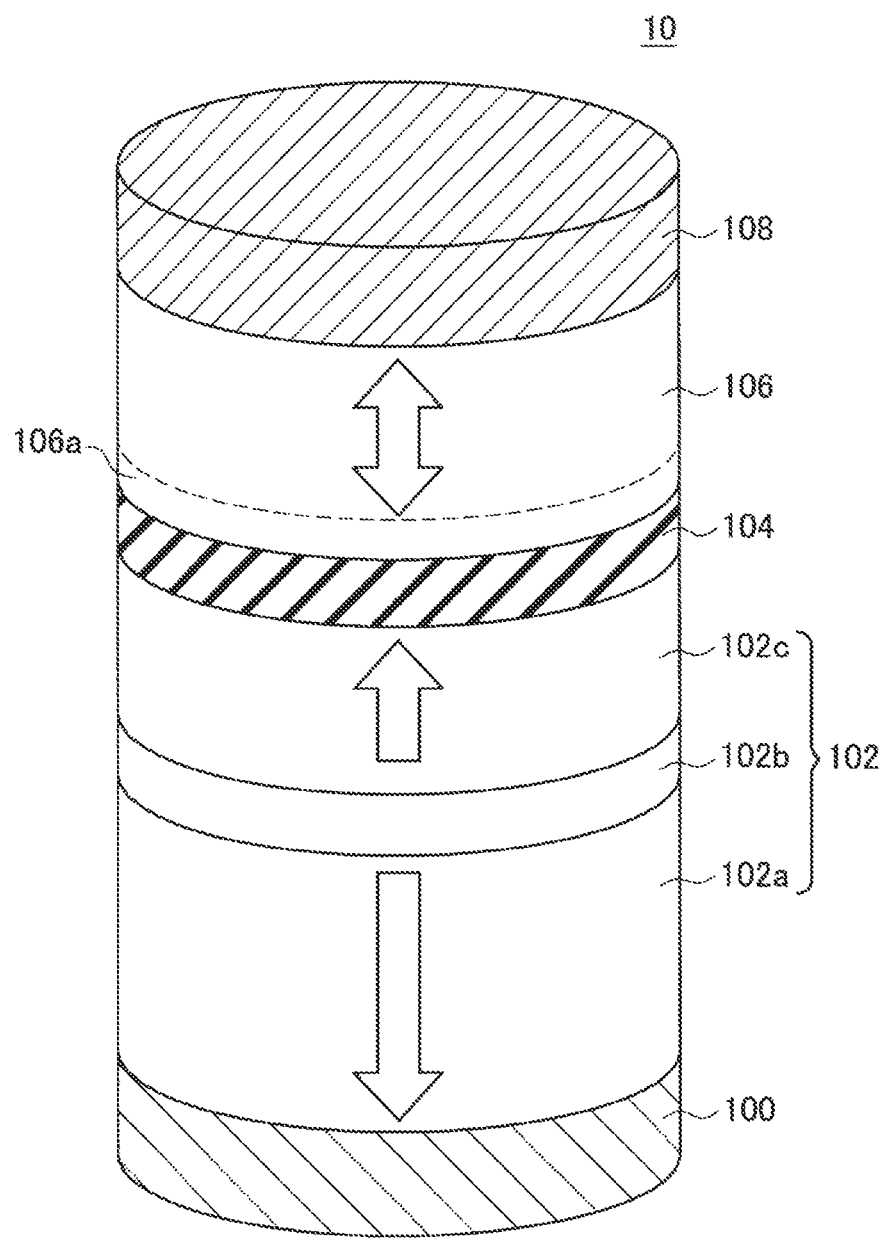
FIG. 2 is a schematic diagram illustrating a stack structure of an MTJ element 10 according to an embodiment of the present disclosure.

Next, details of a structure of an MTJ element 10 according to an embodiment of the present disclosure will be described with reference to FIG. 2. FIG. 2 is a schematic diagram illustrating a stack structure of the MTJ element 10 according to the embodiment of the present disclosure. Note that it is assumed that the MTJ element 10 according to the present embodiment described below is a perpendicular magnetization type STT-MRAM. That is, it is assumed that a magnetization direction of a magnetic layer (specifically, a fixed layer 102 and a storage layer 106, see FIG. 2) included in the stack structure of the MTJ element 10 has a direction perpendicular to a film surface, in other words, a stack direction of the above stack structure.

As illustrated in FIG. 2, the MTJ element (magnetic storage element) 10 according to the present embodiment has a stack structure in which the base layer 100, the fixed layer 102, a non-magnetic layer 104, the storage layer 106, and a cap layer 108 are sequentially stacked from the side of the base layer 100. Note that, in the MTJ element 10 described below, a magnetization direction of the storage layer 106 is reversed by spin torque magnetization reversal, but a magnetization direction of the fixed layer 102 is not reversed, that is, the magnetization direction is fixed. Further, the non-magnetic layer 104 is sandwiched between the fixed layer 102 and the storage layer 106.

The base layer 100 is made of, for example, a film provided on a silicon substrate (not illustrated) having a film thickness of about several 100 μm for controlling the crystal orientation of the fixed layer 102 and improving the adhesion strength to the substrate. For example, the base layer 100 may be formed of a material whose crystal orientation or magnetic anisotropy is substantially the same as that of the fixed layer 102. Specifically, the base layer 100 includes a Ta (tantalum) film having a film thickness of several nm and a Ru (ruthenium) film having a film thickness of about several tens nm. Note that, when the base layer 100 has a metal film made of a metal material such as Cu having a film thickness of about 100 nm, the metal film can also function as a lower electrode (for example, a word line) of the MTJ element 10. Further, a thermal oxide film having a film thickness of about 100 nm may be provided between the silicon substrate and the base layer 100.

The fixed layer 102 has a film thickness of, for example, 1 nm or more and 30 nm or less. For example, as illustrated in FIG. 2, the fixed layer 102 has a structure in which a magnetization fixed layer 102a, a coupling layer 102b, and a reference layer 102c are sequentially stacked from the side of the base layer 100. The reference layer 102c is formed of a ferromagnetic material having a magnetic moment whose magnetization direction is fixed in the direction perpendicular to the film surface. Since the reference layer 102c is a standard for information stored in the MTJ element 10, it is required that the magnetization direction does not change due to writing, storage, or reading. However, the magnetization direction does not necessarily have to be fixed in a specific direction, and the reference layer 102c may have a characteristic that the magnetization direction is less likely to change as compared with the storage layer 106. For example, the reference layer 102c is less likely to change its magnetization direction than the storage layer 106 by increasing the coercive force, increasing the film thickness, or increasing the magnetic damping constant as compared with the storage layer 106. The reference layer 102c is made of a magnetic film containing at least one element selected from the transition metal element group of magnetic transition metal elements consisting of Fe (iron), Co (cobalt), Ni (nickel), and Mn (manganese). That is, the reference layer 102c is made of a magnetic film containing any one of Fe, Co, and Ni that exhibit ferromagnetism at room temperature, or Mn that exhibits ferromagnetism when an alloy or intermetallic compound is formed. Further, the magnetic film may contain at least one type of element selected from B and C (carbon). More specifically, the reference layer 102c has a film thickness of, for example, about several nm, and may be formed of a single material such as FeCoB, FeNiB, FeCoC, CoPt, FePt, CoMnSi, or MnAl, or may be formed of a combination thereof.

In the present embodiment, when the magnetization direction of the reference layer 102c is fixed, the magnetization fixed layer 102a made of an anti-ferromagnetic material such as CoPt, PtMn, or IrMn and having a film thickness of about several nm may be brought into direct contact with the reference layer 102c. Alternatively, in the present embodiment, the magnetization fixed layer 102a made of the anti-ferromagnetic material described above may be magnetically coupled to the reference layer 102c via the coupling layer 102b made of a non-magnetic material such as Ru, and the magnetization direction of the reference layer 102c may be indirectly fixed. The coupling layer 102b may have a film thickness of, for example, about 1 nm, and may be formed of a non-magnetic metal material such as Cr (chromium), Cu (copper), Re (rhenium), Rh (rhodium), Os (osnium), or Ir (iridium), in addition to Ru.

The stack structure including the magnetization fixed layer 102a, the coupling layer 102b, and the reference layer 102c using the magnetic coupling described above is also referred to as, for example, a stacked ferripin structure. A structure in which the stacked ferripin structure including the magnetization fixed layer 102a, the coupling layer 102b, and the reference layer 102c is provided on the lower side (that is, the side of the base layer 100) with respect to the storage layer 106 is also referred to as a bottom pin structure, and a structure in which the stacked ferripin structure is provided on the upper side (that is, the side of the cap layer 108) with respect to the storage layer 106 is also referred to as a top pin structure. Note that, in the present embodiment, the MTJ element 10 may have either the bottom pin structure or the top pin structure.

In the present embodiment, since the fixed layer 102 has the stacked ferripin structure as described above, it is possible to blunt the sensitivity of the fixed layer 102 with respect to the external magnetic field, block the leakage magnetic field caused by the fixed layer 102, and strengthen the perpendicular magnetic anisotropy of the fixed layer 102 by interlayer coupling of a plurality of magnetic layers. Note that a method for fixing the magnetization direction of the fixed layer 102 can be used regardless of whether the fixed layer 102 is below the storage layer 106 or above the storage layer 106.

The non-magnetic layer 104 is a layer formed of an insulating material such as MgO, and has a film thickness of, for example, 0.3 nm or more and 5 nm or less. The non-magnetic layer 104 can be configured using various insulators such as $Al_2O_3$, AlN, $SiO_2$, $Bi_2O_3$, $MgF_2$, CaF, $SrTiO_2$, $AlLaO_3$, and Al—N—O, dielectrics, and semiconductors, in addition to the materials described above.

Furthermore, in the present embodiment, when the non-magnetic layer 104 is formed of MgO, a magnetoresistance change rate (MR ratio) can be increased. By increasing the MR ratio as described above, efficiency of spin injection in the MTJ element 10 is improved, so that a current density required for reversing the magnetization direction of the storage layer 106 can be reduced. In addition, in the present embodiment, the material of the non-magnetic layer 104 functioning as an intermediate layer may be replaced with a metal material, and spin injection by a giant magnetoresistance (GMR) effect may be performed.

The storage layer 106 is made of a ferromagnetic material having a magnetic moment whose magnetization direction freely changes in the direction (stack direction) perpendicular to the plane of the stack structure of the MTJ element 10. Specifically, the storage layer 106 is made of a magnetic film containing at least one transition metal element selected from the element group of magnetic transition metal elements consisting of Fe, Co, Ni, and Mn, similarly to the reference layer 102c. Further, the magnetic film may contain at least one type of element selected from B and C. More specifically, the storage layer 106 may be formed of a single material such as FeCoB, FeNiB, FeCoC, CoPt, FePt, CoMnSi, or MnAl, or may be formed of a combination of these materials. Note that the storage layer 106 preferably contains the above transition metal element of 80 atm % or more with respect to all elements excluding contained elements described later. Further, the storage layer 106 preferably contains as few rare earth elements as possible in order to avoid deterioration of heat resistance characteristics. Further, the film thickness of the storage layer 106 is, for example, 1 nm or more and 10 nm or less.

In the present embodiment, particularly, in the perpendicular magnetization film in the storage layer 106, a composition is preferably adjusted so that the magnitude of the effective demagnetizing field received by the perpendicular magnetization film is smaller than a saturation magnetization amount Ms. For example, a Co—Fe—B composition in the ferromagnetic material of the storage layer 106 is adjusted to reduce the magnitude of the effective demagnetizing field received by the storage layer 106, so that the magnitude is smaller than the saturation magnetization amount Ms of the storage layer 106. In this way, the magnetization direction of the storage layer 106 is oriented in the direction perpendicular to the film surface.

In addition, in the present embodiment, as illustrated in FIG. 2, the storage layer 106 can have a high-concentration region 106a containing at least one contained element selected from the element group consisting of B, C, N (nitrogen), Al (aluminum), Mg (magnesium), and Si (silicon) at 30 atm % or more and 80 atm % or less. Further, the content of the contained element in the high-concentration region 106a is preferably 75 atm % or less, more preferably 70 atm % or less, and further preferably 65 atm % or less. Note that the entire layer of the storage layer 106 may contain the above contained element at 30 atm % or more and 80 atm % or less. In this case, it can be said that the storage layer 106 is the high-concentration region 106a as a whole.

Specifically, as illustrated in FIG. 2, the high-concentration region 106a is located on the side of the interface of the storage layer 106 with the non-magnetic layer 104, in the stack structure of the MTJ element 10. The high-concentration region 106a is preferably located in the vicinity of the interface along the stack direction of the stack structure (here, the interface and a region up to the height about 5 nm away from the interface along the stack direction are referred to as the vicinity), and is more preferably located at a position closer to the interface. Further, in the present embodiment, the high-concentration region 106a may be in contact with the non-magnetic layer 104, or may be located at a position apart from the non-magnetic layer 104.

Further, the high-concentration region 106a preferably has a film thickness of 0.2 nm or more and 2 nm or less in the stack structure. However, in the present embodiment, the high-concentration region 106a may not be provided as a layer that completely covers a top surface of the non-magnetic layer 104 or in a layered form. For example, a covered portion that is present so as to be covered by the high-concentration region 106a and an uncovered portion that is not covered by the high-concentration region 106a may be mixed on the top surface of the non-magnetic layer 104. That is, in the present embodiment, the high-concentration region 106a may be provided so as to be scattered in the storage layer 106, or may not be provided as a layer or in a layered form.

Further, the high-concentration region 106a contains at least one transition metal element selected from the element group of magnetic transition metal elements consisting of Fe, Co, Ni, and Mn, similarly to the other regions of the storage layer 106. Furthermore, the transition metal element is preferably 80 atm % or more with respect to all elements excluding the contained elements selected from the element group consisting of B, C, N, Al, Mg, and Si from all the elements contained in the high-concentration region 106a. Further, similarly to the other regions of the storage layer 106, the high-concentration region 106a preferably contains as few rare earth elements as possible in order to avoid deterioration of heat resistance characteristics.

In the present embodiment, by providing the high-concentration region 106a containing at least one contained element selected from the element group consisting of B, C, N, Al, Mg, and Si at 30 atm % or more, the storage layer 106 can have suitable magnetic characteristics. That is, in the present embodiment, by providing the high-concentration region 106a described above in the vicinity of the interface of the non-magnetic layer 104, amorphization of the magnetic film of the storage layer 106 during film formation and heat treatment in the manufacturing process is maintained, and the anisotropic magnetic field in the direction perpendicular to the film surface generated in the vicinity of the interface of the magnetic film increases. Therefore, in the present embodiment, the high-concentration region 106a is preferably located in the vicinity of the interface along the stack direction of the stack structure. Although details will be described later, according to the examination by the present inventors, considering that the temperature is about 400° C. in the heat treatment of the manufacturing process and the temperature is about 500° C. in consideration of the mass production process, at least one contained element selected from the element group consisting of B, C, N, Al, Mg, and Si is preferably contained at 30 atm % or more. In this way, the storage layer 106 can maintain suitable magnetic characteristics even when the heat treatment is performed at about 400° C. to 500° C.

Further, in the present embodiment, in mass production of the MTJ element 10, it is required to increase the film formation rate in order to secure high mass productivity. Although details will be described later, according to the examination by the present inventors, it has been found that, when the high-concentration region 106a containing at least one contained element selected from the element group consisting of B, C, N, Al, Mg, and Si is formed, the film formation rate is significantly reduced by increasing the concentration of the contained element. Therefore, in order to obtain an effective film formation rate, according to the examination by the present inventors, the high-concentration region 106a is preferably formed to contain at least one contained element selected from the element group consisting of B, C, N, Al, Mg, and Si at 80 atm % or less.

Therefore, in the present embodiment, the high-concentration region 106a preferably contains at least one contained element selected from the element group consisting of B, C, N, Al, Mg, and Si at 30 atm % or more and 80 atm % or less. In this way, it is possible to secure high mass productivity of the MTJ element 10 while suppressing deterioration of magnetic characteristics due to the heat treatment of the storage layer 106.

Further, in the present embodiment, the storage layer 106 is configured such that the magnitude of the effective demagnetizing field received by the storage layer 106 is smaller than the saturation magnetization amount Ms of the storage layer 106. Therefore, the magnitude of the demagnetizing field received by the storage layer 106 is small. As a result, in the present embodiment, a write current amount for reversing the magnetization direction of the storage layer 106 can be reduced. This is because the storage layer 106 has perpendicular magnetic anisotropy, which is advantageous in terms of the demagnetizing field in an application of the inversion current of the perpendicular magnetization type STT-MRAM.

Further, in the present embodiment, since the write current amount can be reduced without reducing the saturation magnetization amount Ms of the storage layer 106, the saturation magnetization amount Ms of the storage layer 106 can be set to a sufficient amount, and thermal stability of the storage layer 106 can be secured.

In the present embodiment, the thermal stability of the storage layer 106 to be the information holding ability can be sufficiently secured, so that the MTJ element 10 having an excellent characteristic balance can be configured.

The cap layer 108 is formed of various metal materials such as Ta, alloy materials, oxide materials, and the like. The cap layer 108 may protect each stack layer during manufacturing of the MTJ element 10 and may further function as a hard mask. Moreover, when the cap layer 108 is formed of a metal material, the cap layer 108 can also function as an electrode of the MTJ element 10. Further, the film thickness of the cap layer 108 is, for example, 0.5 nm or more and 50 nm or less.

Although not illustrated in FIG. 2, a non-magnetic layer, a magnetization fixed layer, or the like may be provided between the storage layer 106 and the cap layer 108. The non-magnetic layer can be formed of an oxide layer such as $Al_2O_3$ or MgO, similarly to the non-magnetic layer 104 described above. Further, the magnetization fixed layer can be formed of a magnetic material such as CoFeB.

Note that, in the present embodiment, the storage layer 106 may be formed of one layer as illustrated in FIG. 2, or may have a structure in which a plurality of layers are stacked.

Note that, in the present embodiment, the MTJ element 10 is not limited to the above configuration and may have another configuration. For example, the positions of the fixed layer 102 and the storage layer 106 may be exchanged in the stack direction, and other layers may be included.

Further, a plurality of MTJ elements 10 described above may be provided in a matrix like a magnetic storage device 1 described later, and various wires connected to the MTJ elements 10 may be provided. Furthermore, an insulating film (not illustrated) may be embedded between the MTJ elements 10 adjacent to each other among the plurality of MTJ elements 10.

2.2. Method for Manufacturing MTJ Element

Figure 3:
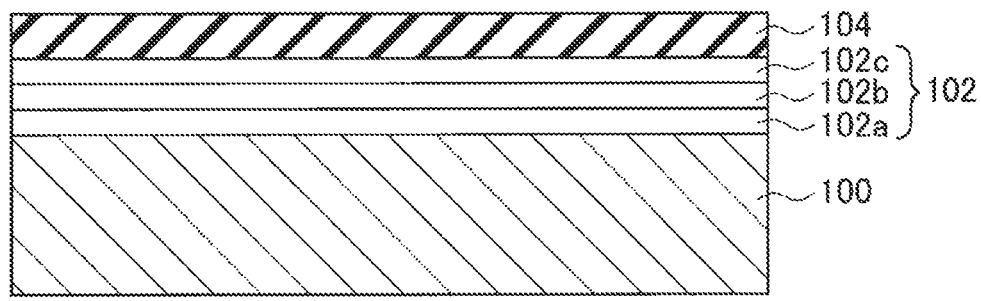
FIG. 3 is a (first) cross-sectional view explaining each step in a method for manufacturing the MTJ element 10 according to the embodiment of the present disclosure.
Figure 4:
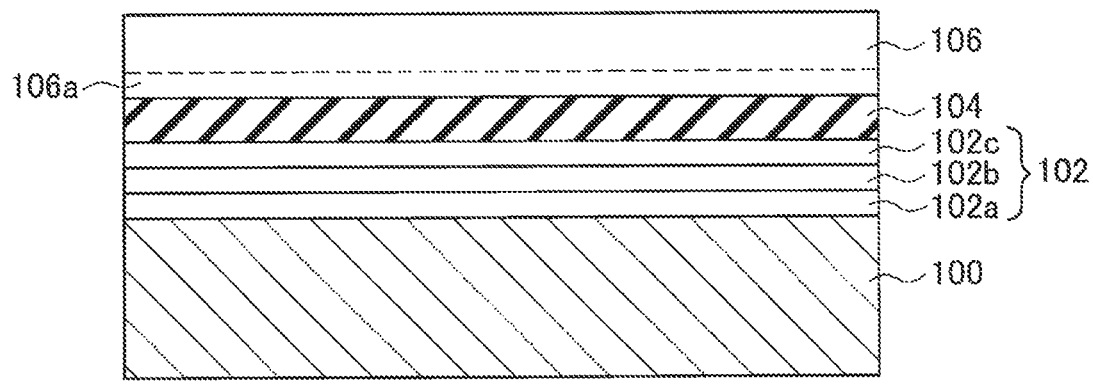
FIG. 4 is a (second) cross-sectional view explaining each step in the method for manufacturing the MTJ element 10 according to the same embodiment.
Figure 5:
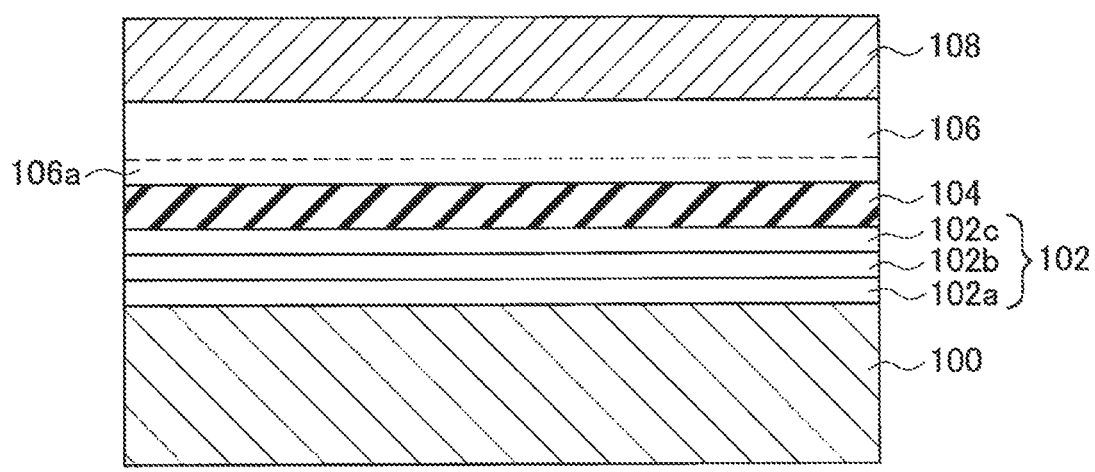
FIG. 5 is a (third) cross-sectional view explaining each step in the method for manufacturing the MTJ element 10 according to the same embodiment.

Next, a method for manufacturing the MTJ element 10 according to the embodiment of the present disclosure will be described with reference to FIGS. 3 to 5. FIGS. 3 to 5 are cross-sectional views illustrating each step in the method for manufacturing the MTJ element 10 according to the present embodiment. These cross-sectional views correspond to cross-sections when the MTJ element 10 is cut along the stack direction of the stack structure of the MTJ element 10. Note that, in the following description, the high-concentration region 106a contains B as a contained element. Further, it is assumed that the MTJ element 10 according to the present embodiment described below is a perpendicular magnetization type STT-MRAM. That is, it is assumed that the magnetization direction of the magnetic layer (specifically, the fixed layer 102 and the storage layer 106) included in the stack structure of the MTJ element 10 has the direction perpendicular to the film surface, in other words, the stack direction of the stack structure.

First, for example, a thermal oxide film (not illustrated) of, for example, several 100 nm is formed on a silicon substrate (not illustrated). Then, for example, a stack film made of a plurality of metal films (not illustrated) such as Ta and Ru having a film thickness of several nm is formed on the thermal oxide film to form the base layer 100.

Then, for example, the magnetization fixed layer 102a made of a Co—Pt film or the like having a film thickness of several nm, the coupling layer 102b made of a Ru film or the like having a film thickness of several nm, and the reference layer 102c made of a $Co_{20}Fe_{80}B_{30}$ film or the like having a film thickness of several nm are sequentially stacked on the base layer 100 to form the fixed layer 102. Further, the non-magnetic layer 104 made of, for example, a MgO film or the like having a film thickness of several nm is formed on the fixed layer 102. In this way, the stack structure illustrated in FIG. 3 can be obtained.

Next, the storage layer 106 is formed on the non-magnetic layer 104 by using a target made of a Co—Pt—B alloy or the like, for example, by a sputtering method (DC magnetron sputtering method or RF magnetron sputtering method). At this time, by using a target having a desired element concentration and inert gas such as Ar (flow rate: several tens to several hundreds of sccm), under a condition of film formation power of about several 100 W, the high-concentration region 106a and the regions other than the high-concentration region 106a in the storage layer 106 are formed. That is, in the present embodiment, by using the target having the desired element concentration, the storage layer 106 having the high-concentration region 106a containing at least one contained element selected from the element group consisting of B, C, N, Al, Mg, and Si at 30 atm % or more and 80 atm % or less can be formed. Further, after film formation, heat treatment at about 350° C. to 400° C. is performed to increase the anisotropic magnetic field in the direction perpendicular to the film surface of the high-concentration region 106a. Note that a frequency is 13.56 MHz when the RF magnetron sputtering method is used. In this way, the stack structure illustrated in FIG. 4 can be obtained.

Further, various metal materials such as Ta, alloy materials, oxide materials, and the like are formed on the storage layer 106 to form the cap layer 108. In this way, the stack structure illustrated in FIG. 5 can be obtained.

Note that, in the present embodiment, unless otherwise specified, layers other than oxide layers are preferably formed by using the DC magnetron sputtering method, and after the formation of each layer, heat treatment is preferably performed at about 350° C. to 400° C. Further, in the present embodiment, unless otherwise specified, the oxide layer is preferably formed by forming a metal layer by using the RF magnetron sputtering method or the DC magnetron sputtering method, performing oxidation treatment (heat treatment) after the film formation, and converting the formed metal layer into the oxide layer.

Further, although not illustrated, a photomask (not illustrated) having a desired pattern is formed on the cap layer 108. Then, using the above photomask as a mask, the cap layer 108, the storage layer 106, the non-magnetic layer 104, the fixed layer 102, and the like are sequentially etched to form the MTJ element 10. As the etching, ion beam etching (IBE) may be used, reactive ion etching (RIE) may be used, or a combination thereof may be used.

As described above, in the manufacturing method according to the present embodiment, the MTJ element 10 can be manufactured by continuously forming the base layer 100 to the cap layer 108 in a vacuum apparatus, and then performing patterning by etching or the like.

2.3. Modification

Figure 6:
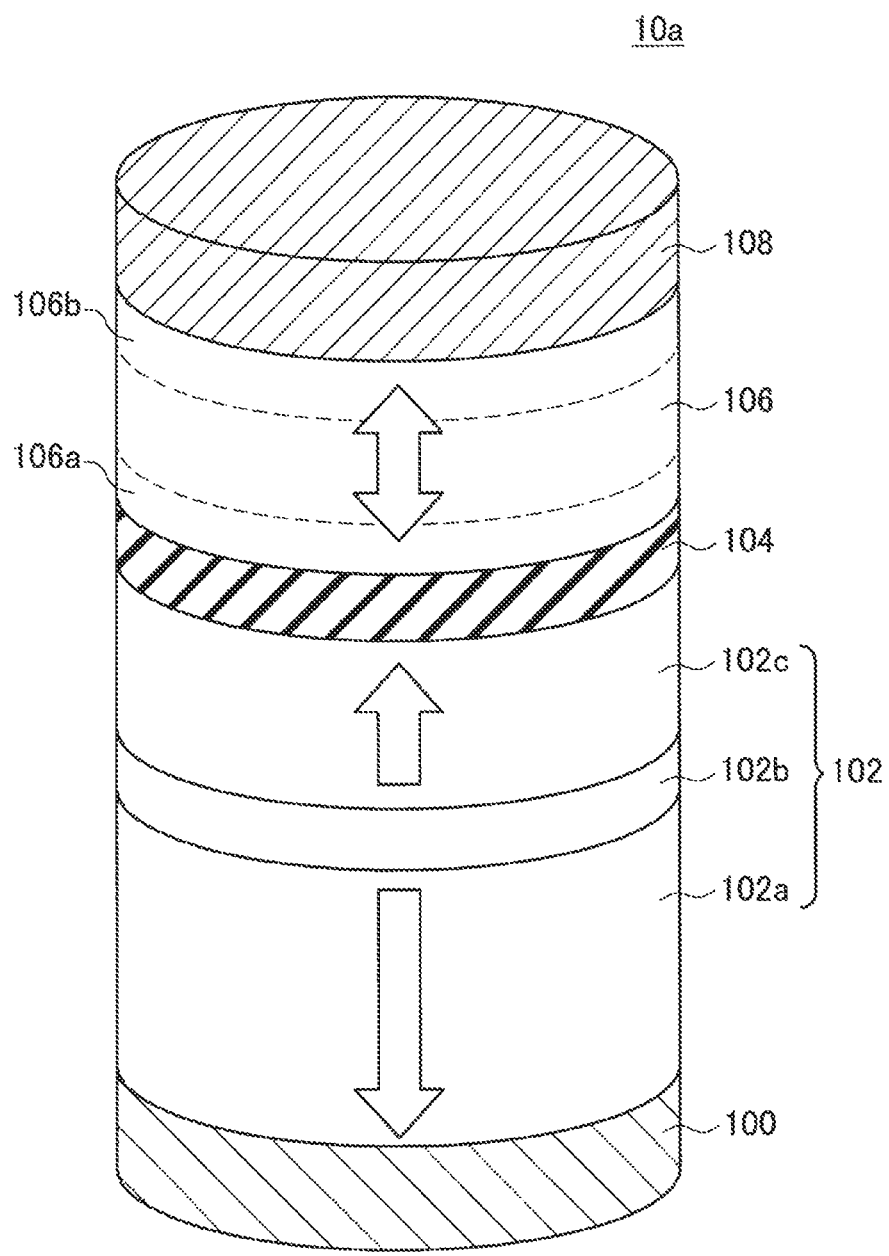
FIG. 6 is a schematic diagram illustrating a stack structure of an MTJ element 10a according to a first modification of the embodiment of the present disclosure.
Figure 7:
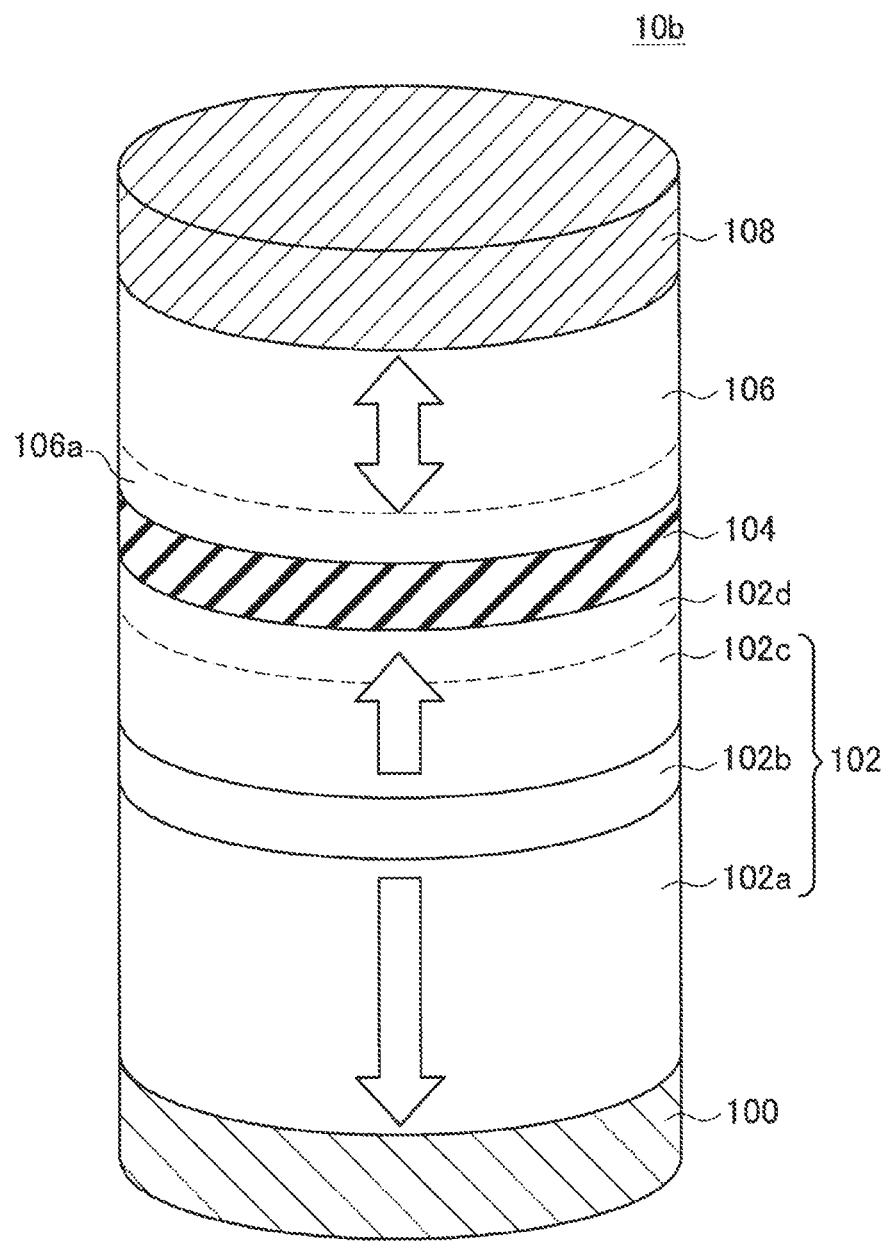
FIG. 7 is a schematic diagram illustrating a stack structure of an MTJ element 10b according to a second modification of the embodiment of the present disclosure.

Note that the MTJ element 10 according to the embodiment of the present disclosure described above can be modified as follows. First and second modifications of the present embodiment will be described below with reference to FIGS. 6 and 7. FIG. 6 is a schematic diagram illustrating a stack structure of an MTJ element 10a according to the first modification of the present embodiment, and FIG. 7 is a schematic diagram illustrating a stack structure of an MTJ element 10b according to the second modification of the present embodiment.

2.3.1 First Modification

In the embodiment of the present disclosure described above, the high-concentration region 106a included in the storage layer 106 is provided in the vicinity of the interface between the storage layer 106 and the non-magnetic layer 104, but the present embodiment is not limited thereto. For example, in the first modification, a high-concentration region 106b may be further provided on the side of the interface between the storage layer 106 and the non-magnetic layer 104.

Specifically, in the first modification, as illustrated in FIG. 6, the storage layer 106 has the high-concentration region 106a and the high-concentration region 106b containing at least one contained element selected from the element group consisting of B, C, N, Al, Mg, and Si at 30 atm % or more and 80 atm % or less. Further, the content of the contained element in the high-concentration region 106b is preferably 75 atm % or less, more preferably 70 atm % or less, and further preferably 65 atm % or less. Further, since the high-concentration region 106a is the same as that in the embodiment of the present disclosure, detailed description thereof will be omitted.

In the first modification, as illustrated in FIG. 6, the high-concentration region 106b is located on the side of the interface of the storage layer 106 with the cap layer 108, in the stack structure of the MTJ element 10a. The high-concentration region 106b is preferably located in the vicinity of the interface along the stack direction of the stack structure (here, the interface and a region up to the height about 5 nm away from the interface along the stack direction are referred to as the vicinity), and is more preferably located at a position closer to the interface. Further, in the first modification, the high-concentration region 106b may be located at a position apart from the cap layer 108. The MTJ element 10a according to the first modification preferably further has an oxide layer (not illustrated) made of an MgO film or the like, which is provided between the storage layer 106 and the cap layer 108, and the high-concentration region 106b is preferably located in contact with the oxide layer or at a position closer to the interface between the storage layer 106 and the oxide layer.

Note that the high-concentration region 106b preferably has a film thickness of 0.2 nm or more and 2 nm or less, similarly to the high-concentration region 106a described above. However, in the first modification, the high-concentration region 106b may not be provided as a layer or in a layered form, similarly to the high-concentration region 106a described above.

Further, the high-concentration region 106b contains at least one transition metal element selected from the element group of magnetic transition metal elements consisting of Fe, Co, Ni, and Mn, similarly to the other regions of the storage layer 106. Furthermore, the transition metal element is preferably 80 atm % or more with respect to all elements excluding the contained elements selected from the element group consisting of B, C, N, Al, Mg, and Si from all the elements contained in the high-concentration region 106a. Further, similarly to the other regions of the storage layer 106, the high-concentration region 106b preferably contains as few rare earth elements as possible in order to avoid deterioration of heat resistance characteristics.

Even in the first modification, similarly to the embodiment of the present disclosure described above, by providing the high-concentration region 106b containing at least one contained element selected from the element group consisting of B, C, N, Al, Mg, and Si at 30 atm % or more and 80 atm % or less, it is possible to secure high mass productivity of the MTJ element 10 while suppressing deterioration of magnetic characteristics due to heat treatment of the storage layer 106. In the first modification, by providing the high-concentration region 106b described above in the vicinity of the interface of the oxide layer (not illustrated), amorphization of the magnetic film of the storage layer 106 during film formation and heat treatment in the manufacturing process is maintained, and the anisotropic magnetic field in the direction perpendicular to the film surface generated in the vicinity of the interface of the magnetic film increases.

2.3.2 Second Modification

In the embodiment of the present disclosure described above, the high-concentration region 106a is provided in the storage layer 106, but the present embodiment is not limited thereto. For example, in the second modification, a high-concentration region 102d may be provided in the fixed layer 102.

Specifically, in the second modification, as illustrated in FIG. 7, the fixed layer 102 has the high-concentration region 106a and the high-concentration region 102d containing at least one contained element selected from the element group consisting of B, C, N, Al, Mg, and Si at 30 atm % or more and 80 atm % or less. Further, the content of the contained element in the high-concentration region 102d is preferably 75 atm % or less, more preferably 70 atm % or less, and further preferably 65 atm % or less. Further, since the high-concentration region 106a is the same as that in the embodiment of the present disclosure, detailed description thereof will be omitted.

In the second modification, as illustrated in FIG. 7, the high-concentration region 102d is located on the side of the interface of the fixed layer 102 (specifically, the reference layer 102c) with the non-magnetic layer 104, in the stack structure of the MTJ element 10b. The high-concentration region 102d is preferably located in the vicinity of the interface along the stack direction of the stack structure (here, the interface and a region up to the height about 5 nm away from the interface along the stack direction are referred to as the vicinity), and is more preferably located at a position closer to the interface. Further, in the second modification, the high-concentration region 102d may be in contact with the non-magnetic layer 104, or may be located at a position apart from the non-magnetic layer 104.

Note that the high-concentration region 102d preferably has a film thickness of 0.2 nm or more and 2 nm or less, similarly to the high-concentration region 106a described above. However, in the second modification, the high-concentration region 102d may not be provided as a layer or in a layered form, similarly to the high-concentration region 106a described above.

Further, the high-concentration region 102d contains at least one transition metal element selected from the element group of magnetic transition metal elements consisting of Fe, Co, Ni, and Mn, similarly to the other regions of the fixed layer 102 (specifically, the reference layer 102c). Furthermore, the transition metal element is preferably 80 atm % or more with respect to all elements excluding the contained elements selected from the element group consisting of B, C, N, Al, Mg, and Si from all the elements contained in the high-concentration region 102d. Further, similarly to the fixed layer 102 (specifically, the reference layer 102c), the high-concentration region 102d preferably contains as few rare earth elements as possible in order to avoid deterioration of heat resistance characteristics.

Even in the second modification, similarly to the embodiment of the present disclosure described above, by providing the high-concentration region 102d containing at least one contained element selected from the element group consisting of B, C, N, Al, Mg, and Si at 30 atm % or more and 80 atm % or less, it is possible to secure high mass productivity of the MTJ element 10b while suppressing deterioration of magnetic characteristics due to heat treatment of the fixed layer 102.

Note that, the fixed layer 102 according to the second modification can be formed in the same manner as the method for forming the storage layer 106 in the method for manufacturing the MTJ element 10 according to the present embodiment described above. Further, the high-concentration region 102d preferably has a film thickness of 0.2 nm or more and 2 nm or less in the stack structure. Further, the entire layer of the fixed layer 102 may contain the above contained element at 30 atm % or more and 80 atm % or less. In this case, it can be said that the fixed layer 102 is the high-concentration region 102d as a whole.

3. EXAMPLE

The details of the embodiment of the present disclosure have been described above. Next, examples of the embodiment of the present disclosure will be described more specifically while illustrating specific examples. Note that the following examples are merely examples of the embodiment of the present disclosure, and the embodiment of the present disclosure is not limited to the following examples.

3.1. Examination of Coercive Force

First, the present inventors have examined a relation between the B (contained element) concentration of the storage layer 106 and a coercive force (Hc) after heat treatment.

Example

First, a thermal oxide film having a film thickness of 300 nm is formed on a silicon substrate having a film thickness of 725 μm. Then, a Cu film having a film thickness of 100 nm, which becomes the lower electrode and the wire of the MTJ element 10, is formed on the thermal oxide film.

Then, the base layer 100, the magnetization fixed layer 102a, the coupling layer 102b, the reference layer 102c, the non-magnetic layer 104, the storage layer 106, and the cap layer 108 are sequentially stacked on the Cu film. Specifically, the base layer 100 is formed of a stack film of Ta having a film thickness of 5 nm and Ru having a film thickness of 10 nm, the magnetization fixed layer 102a is formed of a Co—Pt film having a film thickness of 2 nm, the coupling layer 102b is formed of a Ru film having a film thickness of 0.7 nm, and the reference layer 102c is formed of $(Co_{20}Fe_{80})_{80}B_{30}$ having a film thickness of 1.2 nm. Further, the non-magnetic layer 104 is formed of MgO having a film thickness of 1 nm, the storage layer 106 is formed of $(Co_{20}Fe_{80})_{80}B_{30}$ having a film thickness of 1.6 nm, and the cap layer 108 is formed of a Ta film having a film thickness of 5 nm.

Each layer other than the non-magnetic layer 104 is formed by using the DC magnetron sputtering method. Further, the non-magnetic layer 104 is formed by forming a metal film by using the DC magnetron sputtering method or the RF magnetron sputtering method and then oxidizing it in an oxidation chamber. Further, after forming each of the above layers, heat treatment is performed at 350° C. to 400° C. Note that the storage layer 106 is formed under conditions of room temperature, film formation power of 250 to 350 W, and Ar gas flow rate of 10 to 100 sccm.

Subsequently, the MTJ element 10 according to the example is formed by performing etching processing from the cap layer 108 to the top of the base layer 100 so as to have a columnar shape with a diameter of 50 nm.

Next, by forming an $Al_2O_3$ film to have a thickness of about 100 nm by using a sputtering method, a space between the adjacent MTJ elements 10 is filled, and the adjacent MTJ elements 10 are electrically insulated from each other. Then, the upper electrode and the wire of the MTJ element 10 are formed using the Cu film or the like.

First Comparative Example

Subsequently, a first comparative example will be described. In the first comparative example, the MTJ element 10 is formed, similarly to the example. Note that the first comparative example is different from the above example in that the storage layer 106 is formed of $(Co_{20}Fe_{80})_{80}B_{10}$ having a film thickness of 1.6 nm.

Second Comparative Example

Next, a second comparative example will be described. In the second comparative example, the MTJ element 10 is formed, similarly to the example. Note that the second comparative example is different from the above example in that the storage layer 106 is formed of $(Co_{20}Fe_{80})_{80}B_{20}$ having a film thickness of 1.6 nm.

Figure 8:
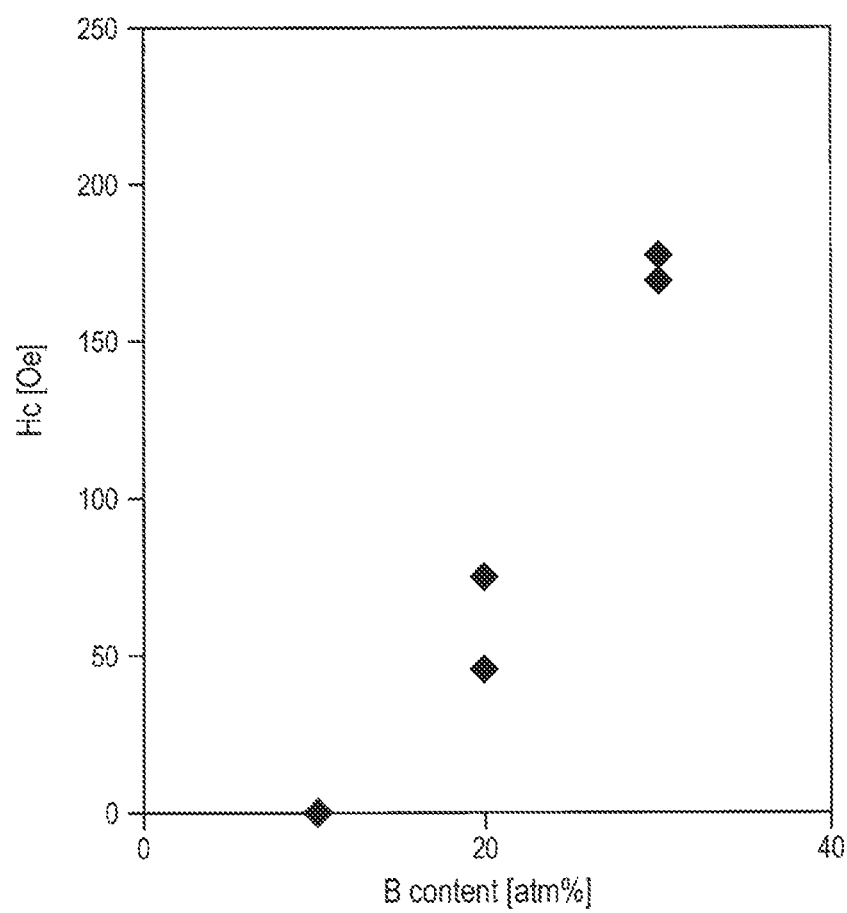
FIG. 8 is a graph illustrating a relation between a B concentration and a coercive force (Hc) after heat treatment, obtained by an examination of the present inventors.

Then, magneto-optical Kerr effect (MOKE) measurement is performed on the MTJ elements 10 according to the example, the first comparative example, and the second comparative example, and the coercive force (Hc) in the perpendicular direction of the storage layer 106 is measured. The results obtained by the measurement are illustrated in FIG. 8. FIG. 8 is a graph illustrating a relation between the B concentration and the coercive force (Hc) after heat treatment (400° C.), obtained by an examination of the present inventors. Note that, in FIG. 8, a horizontal axis represents the B concentration (atm %) of the storage layer 106, and a vertical axis represents the coercive force (Hc) (Oe).

As can be seen from FIG. 8, the coercive force (Hc) in the perpendicular direction of the storage layer 106 increases as the B concentration in the storage layer 106 increases, and when the B concentration is 30 atm % or more, the coercive force (Hc) exceeds 100 Oe and has sufficient perpendicular magnetic anisotropy.

The results illustrated in FIG. 8 are considered to be due to that, by containing B in the storage layer 106, amorphization of the magnetic film of the storage layer 106 during film formation and heat treatment in the manufacturing process is maintained, and the anisotropic magnetic field in the direction perpendicular to the film surface generated in the vicinity of the interface of the storage layer 106 with the non-magnetic layer 104 increases.

3.2. Examination of Film Formation Rate

As described above, when the high-concentration region 106a containing B is formed, the film formation rate is significantly reduced by increasing the B concentration. Therefore, the present inventors have examined a relation between the B concentration of the storage layer 106 and the film formation rate.

In the examination of the film formation rate, the MTJ element 10 is formed in the same manner as in the example described above. However, the examination is different from the example in that the storage layer 106 is formed using targets containing B at various concentrations under a condition of film formation power of 350 W.

Figure 9:
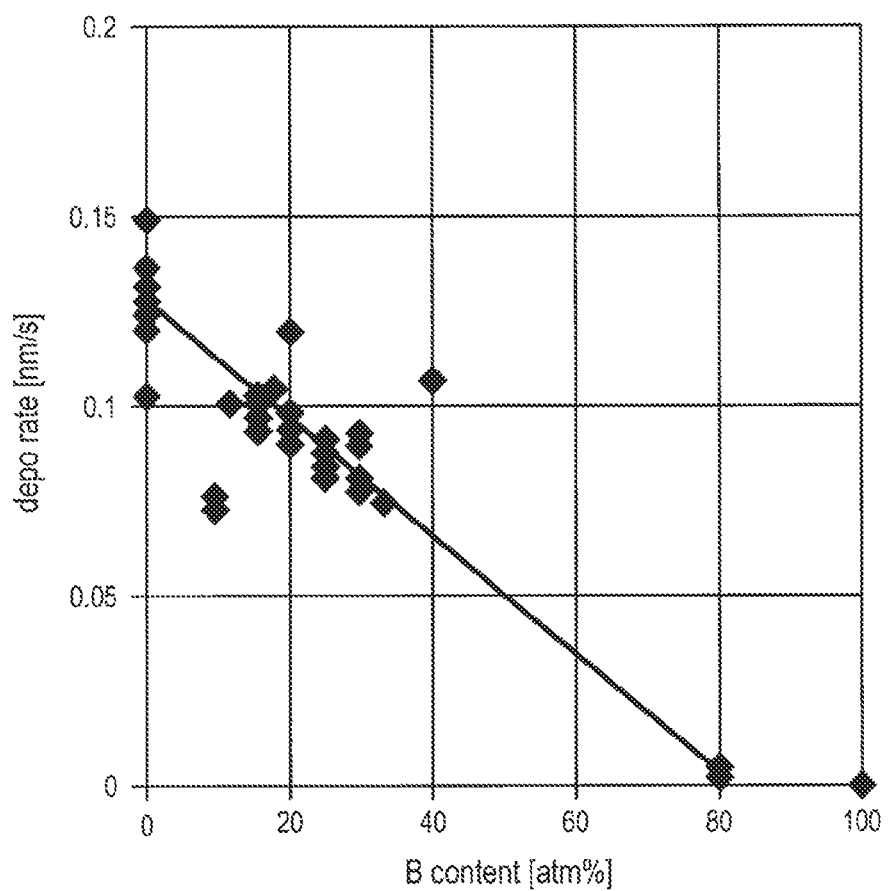
FIG. 9 is a graph illustrating a relation between a B concentration and a film formation rate, obtained by an examination of the present inventors.

The results obtained by the examination are illustrated in FIG. 9. FIG. 9 is a graph illustrating a relation between the B concentration and the film formation rate (nm/sec), obtained by the examination of the present inventors. Note that, in FIG. 9, a horizontal axis represents the B concentration (atm %) of the storage layer 106, and a vertical axis represents the film formation rate (nm/sec).

As can be seen from FIG. 9, the film formation rate of the storage layer 106 significantly decreases as the B concentration in the storage layer 106 increases, and mass production is difficult when the B concentration is 80 atm % or more.

The results of the above examination are summarized in FIG. 10. FIG. 10 is a table summarizing results of the coercive force (Hc) after the heat treatment and the film formation rate with respect to the B concentration, obtained by the examination of the present inventors. In FIG. 10, a result in which the coercive force (Hc) exceeds 100 Oe is regarded as a good product, and a film formation rate of 1 nm/100 sec or more as an effective film formation rate in mass production is regarded as a good product. In FIG. 10, when it is determined that a product is the good product, it is displayed by a circle, and when it is not determined that the product is the good product, it is displayed by an x mark.

As can be seen from FIG. 10, from the viewpoint of the coercive force (Hc) and the viewpoint of the film formation rate, in the good product, the B concentration of the storage layer 106 is 30 atm % or more and 80 atm % or less.

As described above, the storage layer 106 preferably contains B as a contained element at 30 atm % or more and 80 atm % or less. In this way, it is possible to secure high mass productivity of the MTJ element 10 while suppressing deterioration of magnetic characteristics due to the heat treatment of the storage layer 106. In view of the estimated mechanism, the region (high-concentration region 106a) containing B at 30 atm % or more and 80 atm % or less is preferably provided in the vicinity of the interface between the storage layer 106 and the non-magnetic layer 104.

Note that, in view of the above mechanism, the contained element contained in the storage layer 106 is not limited to B, and may be at least one element of C, N, Al, Mg, and Si that behave like B.

4. CONFIGURATION EXAMPLE OF MAGNETIC STORAGE DEVICE

Figure 11:
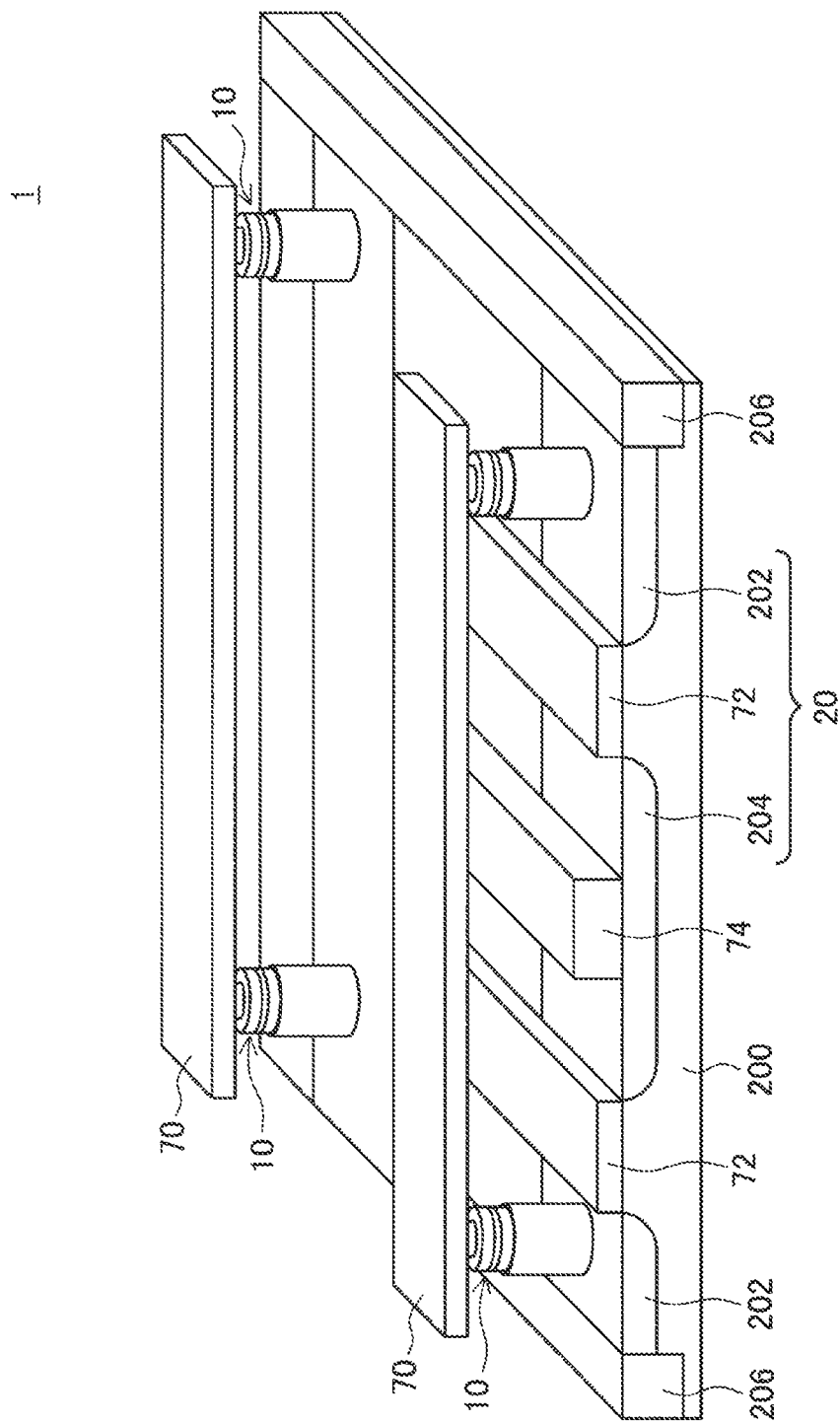
FIG. 11 is a schematic configuration diagram (perspective view) schematically illustrating an example of a magnetic storage device 1 according to an embodiment of the present disclosure.

Hereinafter, a configuration example of a magnetic storage device 1 according to an embodiment of the present disclosure will be described with reference to FIG. 11. FIG. 11 is a schematic configuration diagram (perspective view) schematically illustrating an example of the magnetic storage device 1 according to the present embodiment.

The magnetic storage device 1 according to the present embodiment is a storage device that holds information according to a magnetization direction of a magnetic material. Specifically, as illustrated in FIG. 11, in the magnetic storage device 1 according to the present embodiment, a plurality of MTJ elements 10 according to the present embodiment are disposed in the vicinity of intersections of two types of address wires (for example, bit lines 70 and word lines 72) that intersect each other (or are orthogonal to each other). Further, one terminal of the MTJ element 10 is electrically connected to the bit line 70, and the other terminal of the MTJ element 10 is electrically connected to a selection transistor 20.

More specifically, in the magnetic storage device 1, as illustrated in FIG. 11, the selection transistor 20 for selecting the MTJ element 10 is formed in a region isolated by an element isolation layer 206 of a semiconductor substrate 200 such as a silicon substrate. The selection transistor 20 has a gate electrode (word line) 72, a source region 202, and a drain region 204. Note that, in the example illustrated in the drawing, one memory cell includes the MTJ element 10 and one selection transistor 20 for selecting the MTJ element 10. Further, in the magnetic storage device 1, a plurality of memory cells are arranged on the semiconductor substrate 200. Note that, in FIG. 11, a portion of the magnetic storage device 1 corresponding to four memory cells is extracted and illustrated.

Further, the gate electrode 72 extends in a depth direction in FIG. 11, and also functions as one address wire (word line (second wire) 72). A wire 74 is electrically connected to the drain region 204, and the drain region 204 is configured so that its potential can be changed appropriately via the wire 74. Note that, in the example illustrated in FIG. 11, the drain region 204 is formed commonly to the selection transistors 20 disposed to be adjacent to each other. Further, the MTJ element 10 is disposed above the source region 202. Further, the bit line 70 to be the other address wire extends in a direction orthogonal to the word line 72, above the MTJ element 10. Further, a contact layer (not illustrated) is provided between the source region 202 and the MTJ element 10 and between the MTJ element 10 and the bit line 70. These are electrically connected to each other via the contact layer.

Further, as described above, the MTJ element 10 can write information of 1/0 by reversing the magnetic moment of each storage layer 106 by spin torque magnetization reversal.

Specifically, the magnetic storage device 1 is provided with a power supply circuit (not illustrated) capable of applying a desired current to the word line 72 and the bit line 70. At the time of writing information, the power supply circuit applies a voltage to the address wire (that is, the word line 72 and the bit line 70) corresponding to a desired memory cell to be written, and causes a current to flow through the MTJ element 10. On the other hand, at the time of reading information, the magnetic storage device 1 applies a voltage to the word line 72 corresponding to the desired memory cell to be read by the power supply circuit, and detects the current flowing from the bit line 70 to the selection transistor 20 through the MTJ element 10. By a tunneling magneto resistance (TMR) effect, the electric resistance of the MTJ element 10 changes according to the direction of the magnetic moment in the storage layer 106 of the MTJ element 10. Therefore, information of 1/0 can be read on the basis of the magnitude of the detected current value. At this time, since the current at the time of reading is much smaller than the current flowing at the time of writing, the magnetic direction in the storage layer 106 of the MTJ element 10 does not change at the time of reading. That is, the MTJ element 10 can read information nondestructively.

5. CONFIGURATION EXAMPLE OF ELECTRONIC APPARATUS

Subsequently, an electronic apparatus using the magnetic storage device 1 according to the present embodiment will be described with reference to FIGS. 12 and 13. For example, the electronic apparatus uses the magnetic storage device 1, which is obtained by arranging a plurality of MTJ elements 10 according to the present embodiment in an array, as a large-capacity file memory, a code storage, or a working memory.

5.1. Appearance Example of Electronic Apparatus

First, an appearance of an electronic apparatus 900 using the magnetic storage device 1 according to the present embodiment will be described with reference to FIG. 12. FIG. 12 is a perspective view illustrating an appearance example of the electronic apparatus 900.

Figure 12:
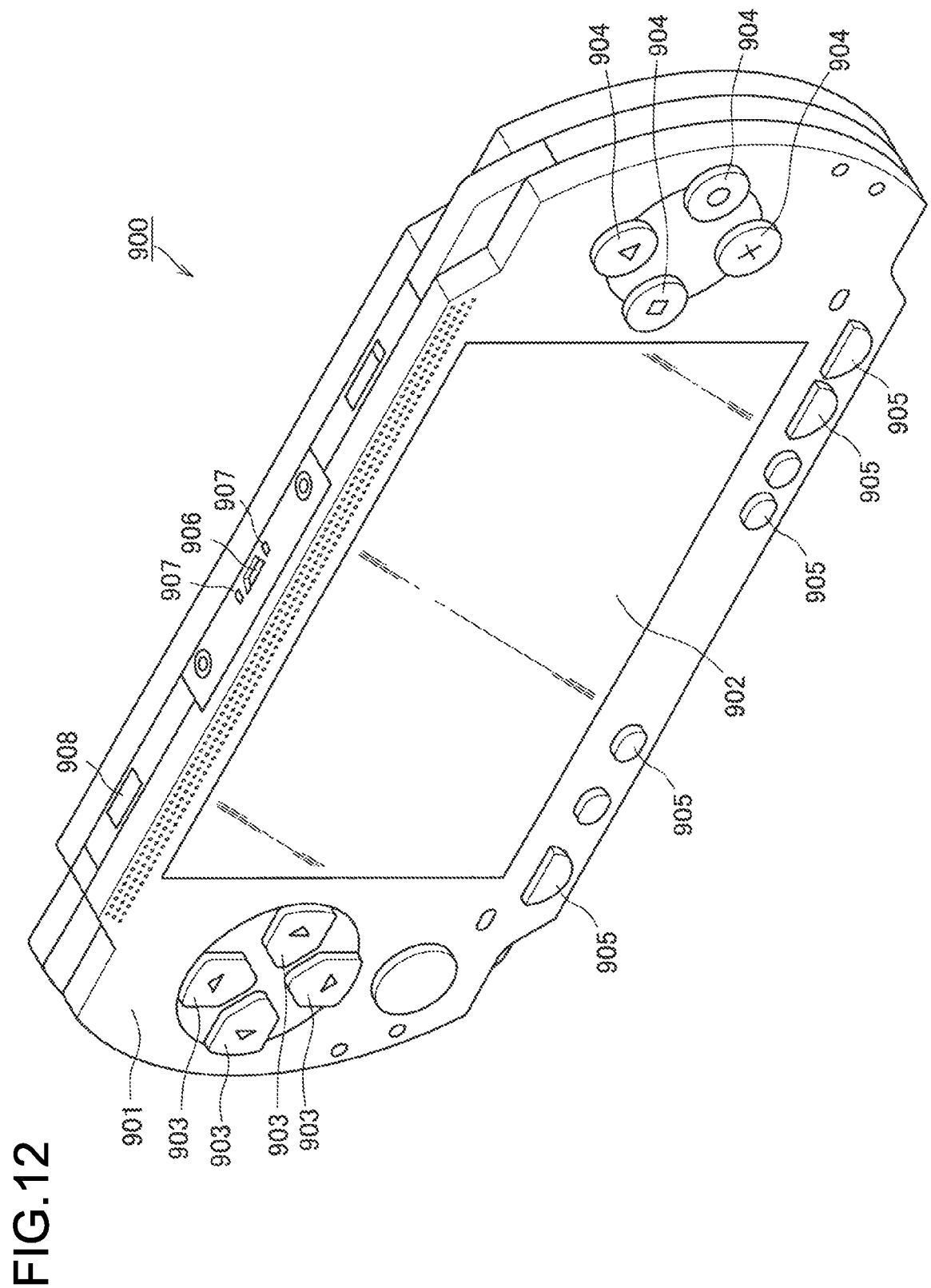
FIG. 12 is a perspective view illustrating an appearance example of an electronic apparatus 900 according to an embodiment of the present disclosure.

As illustrated in FIG. 12, the electronic apparatus 900 has an appearance in which respective components are disposed inside and outside an outer casing 901 formed in a horizontally long and flat shape, for example. The electronic apparatus 900 may be, for example, an apparatus used as a game apparatus.

A display panel 902 is provided on a front surface of the outer casing 901 at a center portion in a longitudinal direction. Further, operation keys 903 and operation keys 904 that are disposed separately in a circumferential direction are provided on the left and right of the display panel 902, respectively. Further, operation keys 905 are provided in a lower end of the front surface of the outer casing 901. The operation keys 903, 904, and 905 function as direction keys or decision keys, and are used for selecting menu items to be displayed on the display panel 902 and advancing a game.

Further, a connection terminal 906 for connecting an external apparatus, supply terminals 907 for supplying power, and a light receiving window 908 for performing infrared communication with the external apparatus are provided on a top surface of the outer casing 901.

5.2. Internal Configuration Example of Electronic Apparatus

Next, an internal configuration of the electronic apparatus 900 will be described with reference to FIG. 13. FIG. 13 is a block diagram illustrating the internal configuration of the electronic apparatus 900.

Figure 13:
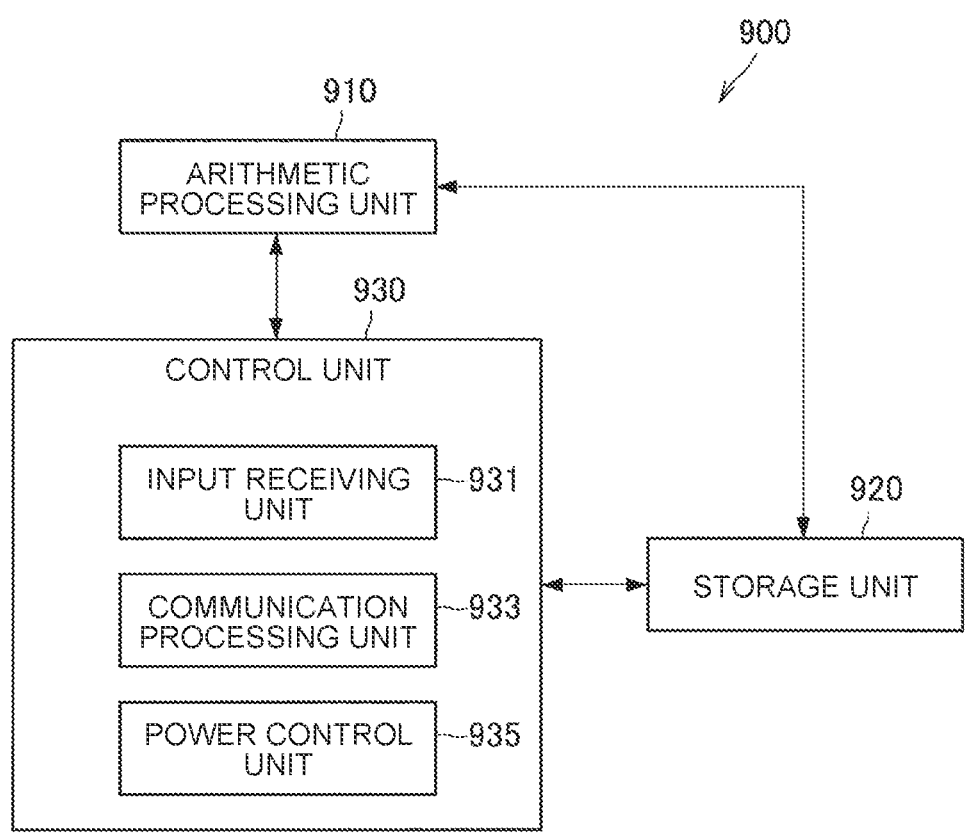
FIG. 13 is a block diagram illustrating an internal configuration of the electronic apparatus 900 according to the same embodiment.

As illustrated in FIG. 13, the electronic apparatus 900 includes an arithmetic processing unit 910 including a central processing unit (CPU), a storage unit 920 for storing various types of information, and a control unit 930 for controlling each component of the electronic apparatus 900. Power is supplied from, for example, a battery or the like (not illustrated) to the arithmetic processing unit 910 and the control unit 930.

The arithmetic processing unit 910 generates a menu screen for allowing a user to set various types of information or select an application. Further, the arithmetic processing unit 910 executes the application selected by the user.

The storage unit 920 holds the various types of information set by the user. The storage unit 920 is configured to include the magnetic storage device 1 according to the present embodiment.

The control unit 930 has an input receiving unit 931, a communication processing unit 933, and a power control unit 935. The input receiving unit 931 detects states of the operation keys 903, 904, and 905, for example. Further, the communication processing unit 933 performs communication processing with the external apparatus. Furthermore, the power control unit 935 controls the power supplied to each unit of the electronic apparatus 900.

According to the present embodiment, the storage unit 920 can have a large capacity and low power consumption. Therefore, the electronic apparatus 900 using the magnetic storage device 1 according to the present embodiment can process a larger amount of information with low power consumption.

Note that the magnetic storage device 1 according to the present embodiment may be mounted on the same semiconductor chip together with a semiconductor circuit forming an arithmetic unit or the like to form a semiconductor device (System-on-a-Chip: SoC). Further, the magnetic storage device 1 according to the present embodiment can be mounted on various electric apparatuses on which the storage device can be mounted as described above. For example, the magnetic storage device 1 according to the present embodiment can be mounted as a memory for temporary storage or a storage on various mobile apparatuses (a smart phone, a tablet PC (Personal Computer), and the like) and various electronic apparatuses such as a notebook PC, a wearable device, a music apparatus, a video apparatus, and a digital camera, in addition to the game apparatus.

6. SUPPLEMENT

Further, although the MTJ element 10 according to the embodiment of the present disclosure has been described as the magnetic storage element configuring the magnetic storage device 1, the MTJ element 10 is not limited to being applied to the magnetic storage device 1. For example, the MTJ element 10 can be a magnetic head, and can be applied to a hard disk drive and a magnetic sensor apparatus equipped with the magnetic head.

The preferred embodiments of the present disclosure have been described in detail with reference to the accompanying drawings, but the technical scope of the present disclosure is not limited to such examples. It is obvious that a person with an ordinary skill in a technological field of the present disclosure could conceive of various alterations or corrections within the scope of the technical ideas described in the appended claims, and it should be understood that such alterations or corrections will naturally belong to the technical scope of the present disclosure.

Furthermore, the effects described in the present specification are merely illustrative or exemplary and are not restrictive. That is, the technology according to the present disclosure can exhibit other effects obvious to those skilled in the art from the description of the present specification in addition to or in place of the above effects.

Note that the following configurations also belong to the technical scope of the present disclosure.

(1)

A magnetic storage element comprising:
a stack structure which includes
a fixed layer whose magnetization direction is fixed,
a storage layer whose magnetization direction is reversible, and
a non-magnetic layer sandwiched between the fixed layer and the storage layer,
wherein the magnetization direction has a direction along a stack direction of the stack structure, and
the fixed layer or the storage layer has
a region which contains at least one contained element selected from the element group consisting of B, C, N, Al, Mg, and Si at 30 atm % or more and 80 atm % or less.

(2)

The magnetic storage element according to (1), wherein the fixed layer or the storage layer contains at least one transition metal element selected from the transition metal element group consisting of Fe, Co, Ni, and Mn.

(3)

The magnetic storage element according to (2), wherein the transition metal element is contained at 80 atm % or more with respect to all elements excluding the contained element contained in the fixed layer or the storage layer.

(4)

The magnetic storage element according to any one of (1) to (3), wherein the region contains B as the contained element.

(5)

The magnetic storage element according to any one of (1) to (4), wherein the region is included in the storage layer.

(6)

The magnetic storage element according to (5), wherein the region is located on a side of an interface of the storage layer with the non-magnetic layer.

(7)

The magnetic storage element according to (6), wherein the region is located so as to be in contact with the non-magnetic layer.

(8)

The magnetic storage element according to (6), wherein the region is located in the vicinity of the interface of the storage layer with the non-magnetic layer.

(9)

The magnetic storage element according to (5), further comprising: a cap layer which is provided on a surface of the storage layer opposite to the non-magnetic layer.

(10)

The magnetic storage element according to (9), wherein the region is located on a side of an interface of the storage layer with the cap layer.

(11)

The magnetic storage element according to (9) or (10), further comprising: an oxide layer which is provided between the storage layer and the cap layer.

(12)

The magnetic storage element according to (11), wherein the region is located so as to be in contact with the oxide layer.

(13)

The magnetic storage element according to any one of (1) to (4), wherein the region is included in the fixed layer.

(14)

The magnetic storage element according to (13), wherein the region is located on a side of an interface of the fixed layer with the non-magnetic layer.

(15)

The magnetic storage element according to any one of (1) to (14), wherein the region has a film thickness of 0.2 nm or more and 2 nm or less in the stack structure.

(16)

The magnetic storage element according to any one of (1) to (15), wherein the non-magnetic layer is made of magnesium oxide.

(17)

A magnetic head comprising:
a stack structure which includes
a fixed layer whose magnetization direction is fixed, a storage layer whose magnetization direction is reversible, and a non-magnetic layer sandwiched between the fixed layer and the storage layer, wherein the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

(18) A magnetic storage device comprising:

a plurality of magnetic storage elements which hold information according to a magnetization state of a magnetic material, wherein each of the magnetic storage elements has a stack structure which includes a fixed layer whose magnetization direction is fixed, a storage layer whose magnetization direction is reversible, and a non-magnetic layer sandwiched between the fixed layer and the storage layer, the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

(19) An electronic apparatus comprising:

a magnetic storage device which has a plurality of magnetic storage elements holding information according to a magnetization state of a magnetic material, wherein each of the magnetic storage elements has a stack structure which includes a fixed layer whose magnetization direction is fixed, a storage layer whose magnetization direction is reversible, and a non-magnetic layer sandwiched between the fixed layer and the storage layer, the magnetization direction has a direction along a stack direction of the stack structure, and the fixed layer or the storage layer has a region which contains at least one contained element selected from the element group consisting of B, C, N, Al, Mg, and Si at 30 atm % or more and 80 atm % or less.

(20) A method for manufacturing a magnetic storage element, the magnetic storage element including a stack structure including a fixed layer whose magnetization direction is fixed, a storage layer whose magnetization direction is reversible, and a non-magnetic layer sandwiched between the fixed layer and the storage layer, the method comprising:

forming the fixed layer or the storage layer by a sputtering method so that the fixed layer or the storage layer has a region which contains at least one contained element selected from the element group consisting of B, C, N, Al, Mg, and Si at 30 atm % or more and 80 atm % or less.

REFERENCE SIGNS LIST

1 MAGNETIC STORAGE DEVICE
10, 10a, 10b MTJ ELEMENT
20 SELECTION TRANSISTOR
70 BIT LINE
72 WORD LINE
100 BASE LAYER
102 FIXED LAYER
102a MAGNETIZATION FIXED LAYER
102b COUPLING LAYER
102c REFERENCE LAYER
102d, 106a, 106b HIGH-CONCENTRATION REGION
104 NON-MAGNETIC LAYER
106 STORAGE LAYER
108 CAP LAYER
200 SEMICONDUCTOR SUBSTRATE
202 SOURCE REGION
204 DRAIN REGION
206 ELEMENT ISOLATION LAYER
900 ELECTRONIC APPARATUS
901 OUTER CASING
902 DISPLAY PANEL
903, 904, 905 OPERATION KEY
906 CONNECTION TERMINAL
907 SUPPLY TERMINAL
908 LIGHT RECEIVING WINDOW
910 ARITHMETIC PROCESSING UNIT
920 STORAGE UNIT
930 CONTROL UNIT
931 INPUT RECEIVING UNIT
933 COMMUNICATION PROCESSING UNIT
935 POWER CONTROL UNIT

What is claimed is:

1. A magnetic storage element, comprising:
a stack structure, wherein the stack structure includes:
a fixed layer, wherein a magnetization direction of the fixed layer is fixed,
a storage layer, wherein a magnetization direction of the storage layer is reversible, and
a non-magnetic layer sandwiched between the fixed layer and the storage layer,
wherein the magnetization direction has a direction along a stack direction of the stack structure,
wherein the fixed layer or the storage layer has a region that contains at least one contained element selected from an element group consisting of B, C, N, Al, Mg, and Si at 30 atm % or more and 80 atm % or less,
wherein the fixed layer or the storage layer contains at least one transition metal element selected from a transition metal element group consisting of Fe, Co, Ni, and Mn, and
wherein the transition metal element is contained at 80 atm % or more with respect to all elements excluding the contained element contained in the fixed layer or the storage layer.

2. The magnetic storage element according to claim 1, wherein the region contains B as the contained element.

3. The magnetic storage element according to claim 1, wherein the region is included in the storage layer.

4. A magnetic storage element, comprising:
a stack structure, wherein the stack structure includes:
a fixed layer, wherein a magnetization direction of the fixed layer is fixed,
a storage layer, wherein a magnetization direction of the storage layer is reversible, and
a non-magnetic layer sandwiched between the fixed layer and the storage layer,
wherein the magnetization direction has a direction along a stack direction of the stack structure,
wherein the fixed layer or the storage layer has a region that contains at least one contained element selected from an element group consisting of B, C, N, Al, Mg, and Si at 30 atm % or more and 80 atm % or less,
wherein the region is included in the storage layer, and
wherein the region is located on a side of an interface of the storage layer with the non-magnetic layer.

5. The magnetic storage element according to claim 4, wherein the fixed layer or the storage layer contains at least one transition metal element selected from a transition metal element group consisting of Fe, Co, Ni, and Mn.

6. The magnetic storage element according to claim 4, wherein the region is located so as to be in contact with the non-magnetic layer.

7. The magnetic storage element according to claim 4, wherein the region is located in a vicinity of the interface of the storage layer with the non-magnetic layer.

8. The magnetic storage element according to claim 3, further comprising:
a cap layer that is provided on a surface of the storage layer opposite to the non-magnetic layer.

9. A magnetic storage element, comprising:
a stack structure, wherein the stack structure includes:
a fixed layer, wherein a magnetization direction of the fixed layer is fixed,
a storage layer wherein a magnetization direction of the storage layer is reversible, and
a non-magnetic layer sandwiched between the fixed layer and the storage layer,
wherein the magnetization direction has a direction along a stack direction of the stack structure,
wherein the fixed layer or the storage layer has a region that contains at least one contained element selected from an element group consisting of B, N, Al, Mg, and Si at 30 atm % or more and 80 atm % or less, and
wherein the region is included in the storage layer; and
a cap layer that is provided on a surface of the storage layer opposite to the non-magnetic layer,
wherein the region is located on a side of an interface of the storage layer with the cap layer.

10. The magnetic storage element according to claim 8, further comprising:
an oxide layer that is provided between the storage layer and the cap layer.

11. A magnetic storage element, comprising:
a stack structure, wherein the stack structure includes:
a fixed layer, wherein a magnetization direction of the fixed layer is fixed,
a storage layer, wherein a magnetization direction of the storage layer is reversible, and
a non-magnetic layer sandwiched between the fixed layer and the storage layer,
wherein the magnetization direction has a direction along a stack direction of the stack structure,
wherein the fixed layer or the storage layer has a region that contains at least one contained element selected from an element group consisting of B, C, N, Al, Mg, and Si at 30 atm % or more and 80 atm % or less, and
wherein the region is included in the storage layer; and
a cap layer that is provided on a surface of the storage layer opposite to the non-magnetic layer, wherein the region is located so as to be in contact with an oxide layer, and wherein the oxide layer is provided between the storage layer and the cap layer.

12. A magnetic storage element, comprising:
a stack structure, wherein the stack structure includes:
a fixed layer, wherein a magnetization direction of the fixed layer is fixed,
a storage layer, wherein a magnetization direction of the storage layer is reversible, and
a non-magnetic layer sandwiched between the fixed layer and the storage layer,
wherein the magnetization direction has a direction along a stack direction of the stack structure,
wherein the fixed layer or the storage layer has a region that contains at least one contained element selected from an element group consisting of B, C, Al, Mg, and Si at 30 atm % or more and 80 atm % or less, and
wherein the region is included in the fixed layer.

13. The magnetic storage element according to claim 12, wherein the region is located on a side of an interface of the fixed layer with the non-magnetic layer.

14. A magnetic storage element, comprising:
a stack structure wherein the stack structure includes:
a fixed layer, wherein a magnetization direction of the fixed layer is fixed,
a storage layer, wherein a magnetization direction of the storage layer is reversible, and
a non-magnetic layer sandwiched between the fixed layer and the storage layer,
wherein the magnetization direction has a direction along a stack direction of the stack structure,
wherein the fixed layer or the storage layer has a region that contains at least one contained element selected from an element group consisting of B, C, N, Al, Mg, and Si at 30 atm % or more and 80 atm % or less, and
wherein the region has a film thickness of 0.2 nm or more and 2 nm or less in the stack structure.

15. The magnetic storage element according to claim 1, wherein the non-magnetic layer is made of magnesium oxide.

16. The magnetic storage element according to claim 9, wherein the fixed layer or the storage layer contains at least one transition metal element selected from a transition metal element group consisting of Fe, Co, Ni, and Mn.

17. The magnetic storage element according to claim 11, wherein the fixed layer or the storage layer contains at least one transition metal element selected from a transition metal element group consisting of Fe, Co, Ni, and Mn.

18. The magnetic storage element according to claim 12, wherein the fixed layer or the storage layer contains at least one transition metal element selected from a transition metal element group consisting of Fe, Co, Ni, and Mn.

19. The magnetic storage element according to claim 14, wherein the fixed layer or the storage layer contains at least one transition metal element selected from a transition metal element group consisting of Fe, Co, Ni, and Mn.

20. The magnetic storage element according to claim 4, wherein the non-magnetic layer is made of magnesium oxide.

* * * * *